United States Patent
Tsuchiya et al.

(10) Patent No.: US 7,416,967 B2
(45) Date of Patent: Aug. 26, 2008

(54) SEMICONDUCTOR DEVICE, AND METHOD FOR MANUFACTURING THE SAME

(75) Inventors: Yoshinori Tsuchiya, Yokohama (JP);
Masato Koyama, Kanagawa (JP);
Masahiko Yoshiki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 11/526,637

(22) Filed: Sep. 26, 2006

(65) Prior Publication Data

US 2007/0210351 A1 Sep. 13, 2007

(30) Foreign Application Priority Data

Mar. 8, 2006 (JP) .......................... P2006-063290

(51) Int. Cl.
*H01L 21/3205* (2006.01)
(52) U.S. Cl. .................. 438/585; 438/592; 438/275; 438/198; 257/E21.002
(58) Field of Classification Search .................. 438/198, 438/275, 511, 523, 585, 592
See application file for complete search history.

(56) References Cited

U.S. PATENT DOCUMENTS

| | | | | |
|---|---|---|---|---|
| 6,635,521 B2 * | 10/2003 | Zhang et al. | ................. | 438/199 |
| 2003/0180994 A1 * | 9/2003 | Polishchuk et al. | ......... | 438/199 |
| 2006/0105527 A1 * | 5/2006 | Saito | ........................... | 438/275 |

FOREIGN PATENT DOCUMENTS

JP 2005-129551 5/2005

OTHER PUBLICATIONS

Takahashi, et al., "Dual Workfunction Ni-Silicide/HfSiON Gate Stacks by Phase-Controlled Full-Silicidation (PC-FUSI) Technique for 45-nm-node LSTP and LOP Devices", International Electron Devices Meeting Technical Digest, pp. 4.4.1-4.4.4., (2004).
Biswas, et al., "Work function tuning of nickel silicide by co-sputtering nickel and silicon", Applied Physics Letters 87, pp. 171908-1-171908-3, (2005).
Nakatsuka, et al., "Low-Temperature Formation of Epitaxial NiSi$_2$ Layers with Solid-Phase Reaction in Ni/Ti/Si(001) Systems", Japanese Journal of Applied Physics, vol. 44, No. 5A, pp. 2945-2947, (2005).
Hayzelden, et al., "Silicide formation and silicide-mediated crystallization of nickel-implanted amorphous silicon thin films", Journal of Applied Physics 73 (12), pp. 8279-8289, (Jun. 15, 1993).

* cited by examiner

*Primary Examiner*—Zandra Smith
*Assistant Examiner*—Christy L Novacek
(74) *Attorney, Agent, or Firm*—Finnegan, Henderson, Farabow, Garrett & Dunner, L.L.P.

(57) ABSTRACT

According to an aspect of the invention, a semiconductor device comprises: a N-channel MIS transistor comprising; a p-type semiconductor layer; a first gate insulation layer formed on the p-type semiconductor layer; a first gate electrode formed on the first gate insulation layer; and a first source-drain region formed in the p-type semiconductor layer where the first gate electrode is sandwiched along a direction of gate length. The first gate electrode comprises a crystal phase including a cubic crystal of NiSi$_2$ which has a lattice constant of 5.39 angstroms to 5.40 angstroms.

10 Claims, 19 Drawing Sheets

SEMICONDUCTOR DEVICE, AND METHOD FOR MANUFACTURING THE SAME

CROSS-REFERENCE TO RELATED APPLICATIONS

This application is based on and claims the benefit of priority from the prior Japanese Patent Application No. 2006-63290, filed on Mar. 8, 2006; the entire contents of which are incorporated herein by reference.

BACKGROUND

1. Technical Field

The present invention relates to a semiconductor device having a field-effect transistor and to a method for manufacturing the same.

2. Description of Related Art

An ultra-integration silicon circuit is one of the basic technologies that are expected to support a future advanced information society. Higher functionality of an integrated circuit entails higher performance of semiconductor elements which are constituent elements of the integrated circuit; namely, a MOSFET (Metal-Oxide-Semiconductor Field-Effect Transistor), a CMOSFET (Complementary MOSFET), and the like. Higher performance of the element has been basically achieved according to a proportional scaling rule. However, various limitations on physical properties have recently come to pose difficulty in ultra-miniaturization of an element which contribute to higher performance.

For instance, problems are pointed out in connection with a gate electrode using silicon; namely, manifestation of gate parasitic resistance caused by an increase in the operating speed of an element; an reduction in the effective capacitance of an insulation film attributable to depletion of carriers in an interface of the insulation film; and variations in a threshold voltage attributable to punch-through of impurity additives into a channel region. In order to solve these problems, metal gate materials are proposed.

One of the techniques for forming a metal gate electrode is a full silicide gate electrode technique for silicidizing all gate electrodes with Ni or Co. The metal gate electrode requires a work function which varies according to a conductivity type, in order to operate a device at an optimal operation threshold voltage.

The reason for this is that the operation threshold voltage of the MIS transistor is modulated in accordance with variations in the work function ($\Phi$eff: an effective work function) of the gate electrode in the interface between the gate electrode and the gate insulation film. Consequently, variations in the work function of the gate electrode in the vicinity of the interface appear in unmodified form as variations in the operation threshold voltage.

For instance, an attempt has been made to control the work function by adjusting the composition of silicide or a crystalline structure (Please refer K. Takahashi et al., "Dual Work-function Ni-Silicide/HfSiON Gate Stacks by Phase-Controlled Full-Silicidation (PC-FUSI) Technique for 45 nm-node LSTP and LOP Devices," IEDM 2004, 4.4.1-4.4.4 (hereinafter, referred to as "K. Takahashi et al."), and N. Biswas et al., "Workfunction turning of nickel silicide by co-sputtering nickel and silicon," Applied Physics Letters 87, 171908 (2005) "hereinafter referred to as N. Biswas et al.").

"K. Takahashi et al" discloses that a work function pertaining to the composition of $NiSi_2$ lies in the vicinity of about 4.4 eV and is appropriate for NMOS metal and that a work function pertaining to the composition of $Ni_3Si$ lies in the vicinity of about 4.8 eV and is appropriate for PMOS metal. Consequently, these gate electrodes involving composition control show that the effective work function $\Phi$eff varies by about 0.1 eV, which in turn induces variations in the threshold voltage. This is considered to be attributable to the fact that the crystal phase of the gate electrode is not a single phase but a mixed phase. Therefore, a single crystal phase is desired for controlling a work function.

In "K. Takahashi et al", an attempt is made to induce a solid phase reaction in the interface between an Ni layer/a polycrystalline Si layer by varying a thickness ratio of an Ni layer/a polycrystalline Si layer (a composition ratio of NiSi) and a heat treatment temperature (ranging from 350° C. to 650° C.). The document describes that a mixed phase between the NiSi phase and an $Ni_3Si$ phase, a mixed phase between the $Ni_3Si$ phase and an $Ni_{31}Si_{12}$ phase, and a mixed phase between the NiSi phase and the $NiSi_2$ phase are consequently generated. However, for instance, when a single phase; e.g., an $NiSi_2$ phase, is formed, heat treatment at 650° C. or more is required. When silicidation is performed at such a high heat treatment temperature, the gate insulation film is deteriorated, which in turn leads to an increase in a leakage current.

In JP-A-20005-129551, an attempt is made to change the ratio of the thickness of the Ni layer to the thickness of the polycrystalline Si layer, and to subject the layers to heat treatment at 400° C. in a vacuum for one minute, thereby inducing a solid-phase reaction in the interface between the Ni layer and the polycrystalline Si layer. The resultantly-produced (Ni+Si) layer exhibits a work function from about 4.4 eV to about 4.9 eV. However, the layer is considered to be a mixed phase consisting of Ni, Si and various species of $NiSi_x$, and the work function is expected to vary.

K. Takahashi et al. discloses that a work function from about 4.3 eV to about 4.9 eV is exhibited when the silicide composition of $NiSi_x$ is varied. However, various crystal phases are observed from the result of XRD (X-Ray Diffraction) of $NiSi_x$, and a mixed phase is understood to be formed.

Forming Ni silicide having a single-phase crystal structure is difficult. Therefore, variations in threshold value cannot be diminished. Moreover, even when Ni silicide having a single-phase crystal structure can be formed, a silicide reaction induced by high-temperature heat treatment is required, as in the case of the $NiSi_2$ phase, which in turn causes an increase in leakage current. Consequently, Ni silicide of single phase cannot be used for gate electrodes of both conductivity types (particularly type "n").

A known approach is to silicidize single crystal Si and amorphous Si by low-temperature heat treatment at 350° C. to 400° C., thereby generating $NiSi_2$ (see O. Nakatsuka et al., "Low-Temperature Formation of Epitaxial $NiSi_2$ Layers with Solid-Phase Reaction in Ni/Ti/Si (001) Systems," Japanese Journal of Applied Physics, Vol. 44, No. 5A, 2005, pp. 2945-2947 (hereinafter, referred to as "O. Nakatsuka et al."), and C. Hayzelder et al., "Silicide formation and silicide-mediated crystallization of nickel-implanted amorphous silicon thin films," J. Appl. Physics. 73(12), 15 Jun. 1993, pp. 8279-8289. )(herein after referred to as "C. Hayzelder et al.").

"O. Nakatsuka et al." discloses that a multilayer consisting of Ni, a thin layer of Ti, and monocrystal Si is subjected to heat treatment at 350° C. for 30 minutes, to thus produce a multilayer structure consisting of $TiSi_2$, $NiSi_2$, and monocrystal Si. However, an interface between $NiSi_2$/monocrystal Si forms a (111) facet, which in turn induces roughness.

"C. Hayzelder et al." discloses that Ni is ion-implanted into amorphous Si and the amorphous Si is subjected to heat treatment at 400° C. for three hours, to thus generate an $NiSi_2$ crystal seed. However, heat treatment which is as long as three hours is not realistic in processes for manufacturing an LSI.

SUMMARY

The present invention has been made in view of the above circumstances and provides a semiconductor device and a method for manufacturing the same. According to an aspect of the present invention, a semiconductor device can reduces variations in threshold value, as well as a method for manufacturing the same.

According to another aspect of the invention, a semiconductor device comprises: a N-channel MIS transistor comprising; a p-type semiconductor layer; a first gate insulation layer formed on the p-type semiconductor layer; a first gate electrode formed on the first gate insulation layer; and a first source-drain region formed in the p-type semiconductor layer where the first gate electrode is sandwiched along a direction of gate length. The first gate electrode comprises a crystal phase including a cubic crystal of $NiSi_2$ which has a lattice constant of 5.39 angstroms to 5.40 angstroms.

According to another aspect of the invention, a semiconductor device comprises: a substrate; a N-channel MIS transistor comprising; a p-type semiconductor layer formed on the substrate; a first gate insulation layer formed on the p-type semiconductor layer; a first gate electrode formed on the first gate insulation layer; and a first source-drain region formed in the p-type semiconductor layer where the first gate electrode is sandwiched along a direction of gate length; a P-channel MIS transistor comprising; a n-type semiconductor layer formed on the substrate; a second gate insulation layer formed on the n-type semiconductor layer; a second gate electrode formed on the second gate insulation layer. The second gate electrode comprises; a crystal phase including at least one of a cubic crystal of $Ni_3Si$ or a hexagonal crystal of $Ni_{31}Si_{12}$; and a second source-drain region formed in the n-type semiconductor layer where the second gate electrode sandwiched along a direction of gate length. The first gate electrode comprises a crystal phase including a cubic crystal of $NiSi_2$ which has a lattice constant of 5.39 angstroms to 5.40 angstroms.

According to another aspect of the invention, there is provided a method for manufacturing a semiconductor device comprising: forming a first gate insulation layer on a p-type semiconductor layer; forming a first polycrystalline silicon layer on the first gate insulation layer; forming a first source-drain region on a surface of the p-type semiconductor layer where the first polycrystalline silicon layer is sandwiched; performing an ion implantation of Ni into the first polycrystalline silicon layer; performing a heat treatment for forming a $NiSi_2$ crystal nucleus in the first polycrystalline silicon layer at a temperature of 300° C. to 800° C.; forming on the first polycrystalline silicon layer a first Ni layer whose thickness is 5/18 to 1/2 with respect to the thickness of the first polycrystalline silicon layer; and transforming the first polycrystalline silicon layer into a crystal phase of $NiSi_2$ by performing a heat treatment for growing the $NiSi_2$ crystal nucleus at a temperature of 300° C. to 600° C.

According to another aspect of the invention, there is provided a method for manufacturing a semiconductor device comprising: forming a first gate insulation layer on a p-type semiconductor layer; forming a first polycrystalline silicon layer on the first gate insulation layer; forming a first source-drain region on a surface of the p-type semiconductor layer where the first polycrystalline silicon layer is sandwiched; forming a first Ti thin layer on the first polycrystalline silicon layer; forming a first Ni layer on the first Ti thin layer; and performing a heat treatment for transforming a multilayer (the first Ni layer/the first Ti thin layer/the first polycrystalline silicon layer) into a multilayer (a $TiSi_2$ crystal phase/an $NiSi_2$ crystal phase) at a temperature of 300° C. to 600° C.

According to another aspect of the invention, there is provided a method for manufacturing a semiconductor device, comprising: forming a first gate insulation layer on a p-type semiconductor layer; forming a second gate insulation layer on an n-type semiconductor layer; forming a first polycrystalline silicon layer on the first gate insulation layer; forming a second polycrystalline silicon layer on the second gate insulation layer; forming a first source-drain region on a surface of the p-type semiconductor layer where the first polycrystalline silicon layer is sandwiched; forming a second source-drain region on a surface of the n-type semiconductor layer where the second polycrystalline silicon layer is sandwiched; forming a first Ti thin layer on the first polycrystalline silicon layer; forming a first Ni layer on the first Ti thin layer; forming a second Ni layer, or a second Ti thin layer and the second Ni layer in order, on the second polycrystalline silicon layer; performing a first heat treatment at a temperature of 300° C. to 600° C., for transforming a multilayer (the first Ni layer/the first Ti thin layer/the first polycrystalline silicon layer) into a first multilayer (a TiSi2 crystal phase/an NiSi2 crystal phase); and performing a second heat treatment for forming a Ni3Si crystal phase or a Ni31Si12 crystal phase from the second polycrystalline silicon layer.

DESCRIPTION OF THE EMBODIMENTS

Figure 1:
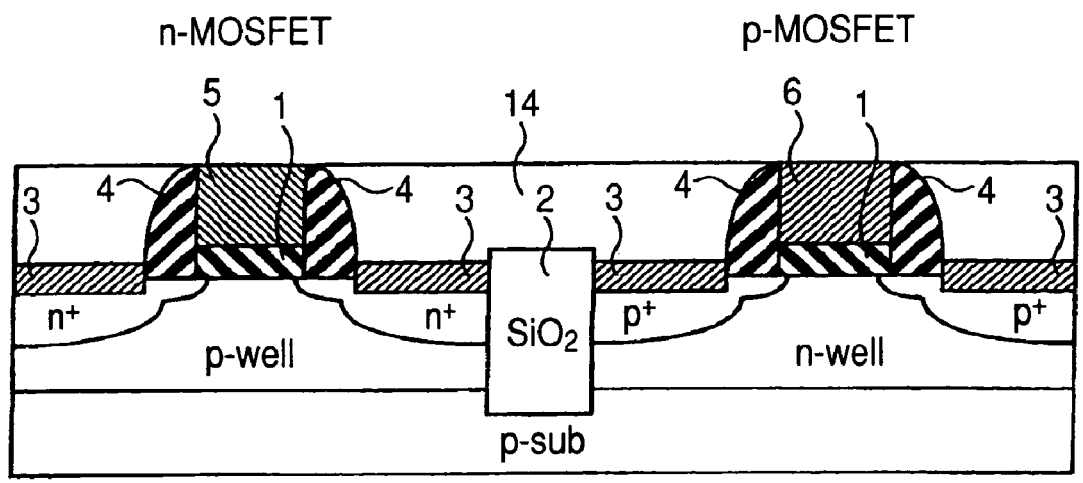
FIG. 1 is an exemplary diagrammatic cross-sectional view in the direction of gate length, showing an example CMOSFET according to a first embodiment.

Embodiments of the present invention will be described hereinbelow by reference to the drawings. Configurations common to the embodiments are assigned the same reference numerals, and repeated explanations thereof are omitted here for brevity. The drawings are exemplary schematic diagrams for describing the invention and promoting comprehension of the invention. Some of the drawings differ from an actual apparatus in terms of shape, dimensions, and proportions. The present invention can be subjected to engineering change, as appropriate, by taking into account the following descriptions and publicly-known techniques.

First Embodiment

An example CMOSFET according to a first embodiment will be described by reference to FIG. 1.

As shown in FIG. 1, a p-type impurity region (a p-well) and an n-type impurity region (an n-well) are formed in a p-type silicon substrate through $SiO_2$ in an element isolation layer. Both gate insulation layers 1 formed on both regions are Silicon oxide films 1. The insulation layer 1 may be formed to a thickness of 2 nm or less. A gate electrode 5 and a gate electrode 6, each of which has a multilayer structure, are formed from Ni silicide on the respective gate insulation layers 1.

The Ni silicide gate electrode 5 on the p-well region is formed from a cubic $NiSi_2$ crystal phase. All areas of the gate electrode 5 include a polycrystallineline layer whose crystal grains each assume a cubic $CaF_2$-type crystal structure and an Ni:Si composition of 1:2. As will be described in detail later, the $NiSi_2$ crystal phase is formed at a low temperature, and hence the lattice constant thereof ranges from 5.39 angstroms to 5.40 angstroms.

The Ni silicide gate electrode 6 on the n-well is formed from a cubic $Ni_3Si$ crystal phase. All areas of the gate electrode 6 include a polycrystallineline layer whose crystal grains assume a cubic $AuCu_3$-type crystal structure and have a composition of Ni:Si=3:1. In addition to the cubic $Ni_3Si$ phase, the Ni silicide gate electrode 6 may be formed from a hexagonal $Ni_{31}Si_{12}$ phase.

In FIG. 1, all of the areas of the gate electrode 5 are formed from the $NiSi_2$ crystal phase. However, an $NiSi_2$ crystal phase may be formed of a layer in an interface area between the gate electrode 5 and the gate insulation layer 1. The same also applies to the gate electrode 6.

The length (gate length) between the source and the drain of a gate structure, consisting of the gate insulation layer 1 and the gate electrodes 5, 6, may be 30 nm or less in connection with both conductivity types.

A source region and a drain region, which correspond to an n-type highly-doped impurity area, are formed in the p-well such that the gate insulation layer 1 is sandwiched therebetween. An Ni silicide layer (NiSi layer) 3, which is a contact electrode, is formed on the source and drain regions. Thus, an N-type MIS transistor is fabricated in the p-type impurity region. In the meantime, a source region and a drain region, which correspond to a p-type highly-doped impurity region, are formed on the n-type impurity region such that the gate insulation layer 1 is sandwiched therebetween. As in the case of the n-type MIS transistor, the Ni silicide layer (NiSi layer) 3, which corresponds to a contact material, is formed on the source and drain regions. Thus, a p-type MIS transistor is fabricated in the n-type impurity region. The n-type MIS transistor and the p-type MIS transistor operate complementarily, to thus form a CMIS device.

In the embodiment, all gate electrodes of both conductivity types can be formed from Ni silicide of a single crystal structure. Gate electrodes of both conductivity types provided immediately above the gate insulation film can be formed from Ni silicide having the same crystal structure (single phase) in the entire interface region. By thus configuration, variations in threshold voltage become smaller than 0.05 eV and allowable at the time of operation of the CMIS device. The variations are greatly smaller than variations in the effective work function $\Phi eff$ of K. Takahashi et al. which are of the order of about 0.1 eV.

A single phase in the interface region is achieved, on condition that crystal grains of the electrodes contacting the interface of the gate insulation film are analyzed with local electron diffraction of 5 nm or less, wherein crystal grains have different orientations but all the crystal grains assume the same crystal structure, or a proportion of another phase to the main crystal phase is 1% or less.

In order to determine whether or not the gate electrode contacts the insulation film, a sample is sliced at an angle perpendicular to the interface between the gate electrode and the insulation film, and local electron diffraction analysis is performed while the cross section is ascertained by an image of a transmission electron microscope. The thickness of the sample may be about one-half the size of the crystal grain which is an object of analysis, so that crystal grains do no overlap in the depthwise direction of the sample and the crystal grains can be determined one by one.

A relationship between the crystal phase of Ni silicide and a crystal system is as follows:

$Ni_3Si$ phase: cubic
$Ni_{31}Si_{12}$ phase: hexagonal
$Ni_2Si$ phase: orthorhombic
NiSi phase: orthorhombic
$NiSi_2$ phase: cubic In the case of an Ni silicide gate electrode, $\Phi eff$ is known to greatly change according to the Ni—Si composition of the gate electrode (see N. Biswas et al.). In reality, in the electrode where NiSi and $NiSi_2$ are mixed together, the effective work function $\Phi eff$ exhibits a variation of about 0.1 eV including those described in K. Takahashi et al, the entire contents of this reference being incorporated herein by reference.

Although detailed descriptions (see a manufacturing method of a first or third embodiment) will be provided later, under the manufacturing method of the embodiment, an $NiSi_2$ phase, which is negatively larger than an orthorhombic MnP-type NiSi phase in terms of heat of formation and thermodynamically stable, is formed as a first phase by an Ni silicidation reaction. Under the manufacturing method of the embodiment, a mixed phase consisting of the NiSi phase and the $NiSi_2$ phase is not formed in the interface between the gate electrode and the gate insulation layer unless Ni is excessively present.

The gate electrode 5 of the n-type MIS transistor is formed from a cubic $NiSi_2$ crystal phase whose lattice constant is 5.39 angstroms to 5.40 angstroms, and the lattice constant may be 5.393 angstroms or more. The lattice constant is unique to the $NiSi_2$ crystal phase formed through a heat treatment process (e.g., 450° C.) which is lower than an ordinary temperature (650° C. or higher) at which $NiSi_2$ is formed by an Ni/Si interface reaction. This will be described in detail later by reference to FIG. 20.

Figure 20:
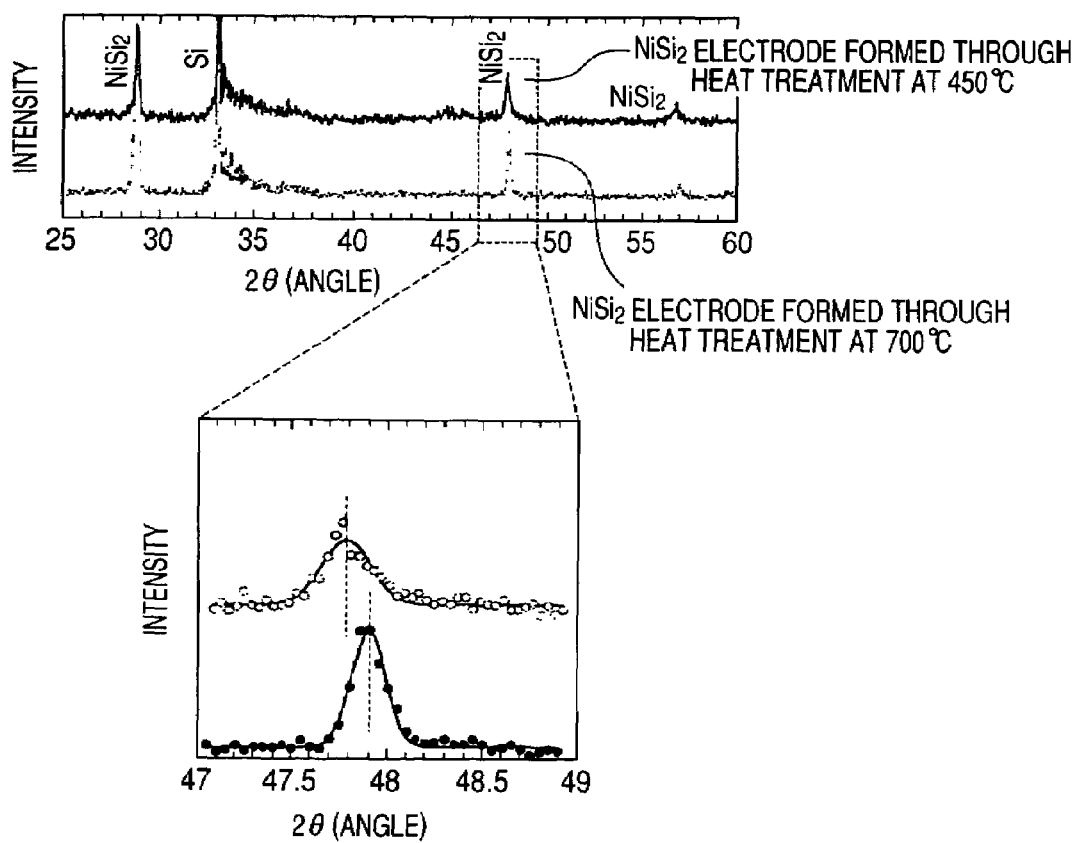
FIG. 20 exemplary shows an X-ray diffraction spectrum of $NiSi_2$ phase formed through heat treatment at 450° C. and 700° C.

FIG. 20 shows an X-ray diffraction spectrum of the $NiSi_2$ phase formed through a heat treatment process of 450° C. in the present embodiment and an X-ray diffraction spectrum of the $NiSi_2$ phase formed through a high-temperature treatment process of 700° C.

These X-ray diffraction spectra are measured at room temperature by use of $CuK\alpha$ as the X-ray source and a $\theta/2\theta$ method. Diffraction peaks of cubic $NiSi_2$ are obtained under both conditions for formation.

Data obtained through XRD analysis correspond to a diffraction profile which is different from a profile obtained through above-described local electron diffraction and reflects all crystal structures including the entire gate electrode and the Si substrate. In FIG. 20, only the diffraction peak of the $NiSi_2$ structure is detected as an electrode silicide phase by the XRD profile, and hence the entire gate electrode and the interface of the gate insulation film are understood to exhibit a "single phase."

All diffraction peaks of the $NiSi_2$ crystal phase of the present embodiment appear at angles which are lower than those at which the diffraction peak appear when the crystal phase is formed through a high-temperature heat treatment process. A difference arises in lattice constants; namely, the $NiSi_2$ crystal phase formed at a low temperature in the present embodiment exhibits a lattice constant of 5.393 angstroms and the $NiSi_2$ crystal phase formed through high-temperature heat treatment of 700° C. exhibits a lattice constant of 5.381 angstroms. The lattice constant of $NiSi_2$ formed at a low temperature is greater by 0.2%. When compared with the lattice constant (5.406 angstroms) of a $NiSi_2$ phase of a bulk, the lattice constant obtained when the $NiSi_2$ crystal phase is formed at a low temperature is closer to the lattice constant of the bulk.

This is attributable to a difference in the temperatures at which the crystal phase is formed. When the crystal phase is formed through low-temperature heat treatment, heat contraction is small, and hence a deviation from the lattice constant of the bulk becomes smaller.

Even when compared with the lattice constant (5.431 angstroms) of Si, the lattice constant of $NiSi_2$ formed at a low temperature is 0.6%, which is smaller than the lattice constant (0.9%) of $NiSi_2$ formed through high-temperature heat treatment. This signifies that application of mechanical strain induced by a volumetric change, which arises during silicidation of polycrystalline Si during manufacturing processes, is small. The mechanical strain applied to the gate insulation film and the gate sidewall, which are proximate to the gate electrode, is lessened, and the reliability of the transistor is enhanced. Further, deterioration of electron mobility, which would arise by application of a compressive strain to a channel section, is prevented, whereby high-speed operation of the device is considered to become possible.

Figure 21:
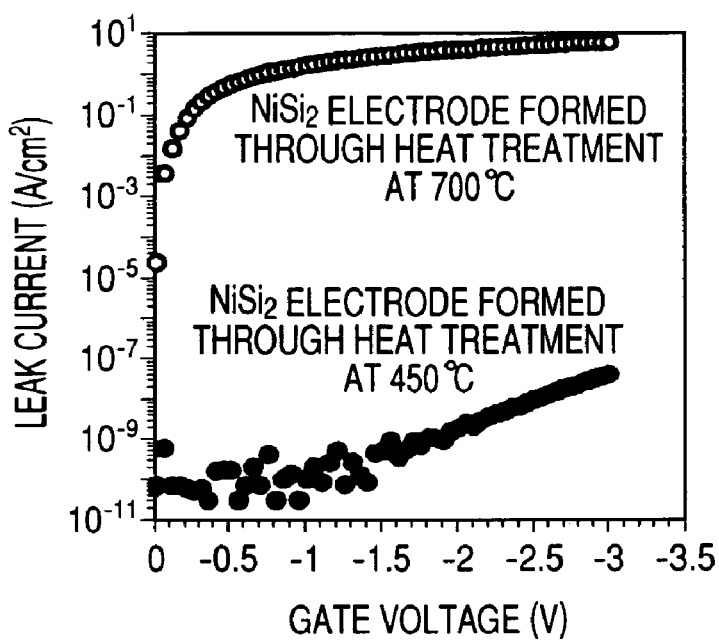
FIG. 21 exemplary shows a leak current characteristic of a MOS capacitor which uses as a gate electrode the $NiSi_2$ phase formed through heat treatment at 450° C. and 700° C.

FIG. 21 shows a leakage current characteristic of a MOS capacitor having the $NiSi_2$ phases, which have been formed by the respective methods, as gate electrodes. The employed gate insulation film is made of $SiO_2$ and has a thickness of 7 nm. In the case of the $NiSi_2$ phase formed through high-temperature heat treatment of 700° C., a leakage current is increased by diffusion of Ni elements into the gate insulation film through the high-temperature heat process. In contrast, in the case of the $NiSi_2$ phase formed at a low temperature of 450° C. in the present embodiment, diffusion of Ni elements into the gate insulation film is lessened because only low-temperature processes are performed. Damage attributable to diffusion of Ni elements does not arise, and a low leakage current characteristic can be maintained.

Figure 22:
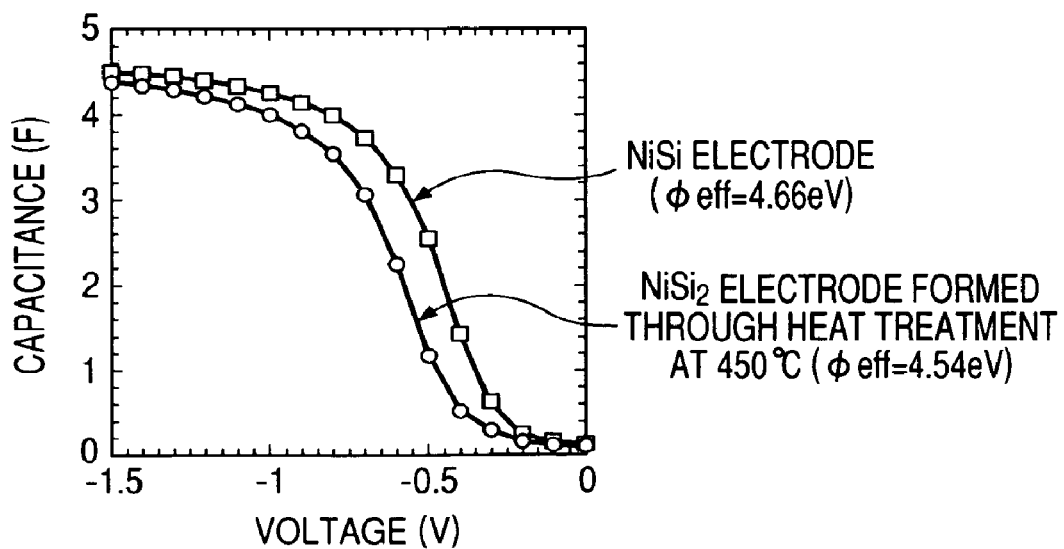
FIG. 22 exemplary shows a capacitance-voltage (C-V) characteristic of the MOS capacitor which uses as gate electrodes $NiSi_2$ phase formed at low temperature and NiSi crystal phase of orthorhombic MnP type.

FIG. 22 shows a capacitance-voltage (C-V) characteristic of the MOS capacitor employing the $NiSi_2$ electrode—formed at a low temperature—and the orthorhombic MnP-type NiSi electrode, which belong to the embodiment.

When compared with the case of an NiSi crystal phase electrode, a C-V characteristic of the $NiSi_2$ crystal phase electrode formed at a low temperature shifts toward a negative voltage. By dependence of the thickness of a gate oxide film on the flat band voltage (Vfb) determined from the C-V characteristic, a Vfb voltage achieved when the thickness of an oxide film is zero is extracted through linear extrapolation. The effective work function Φeff of the electrode is extracted by the Fermi level (4.92 eV) of the substrate determined from the concentration of impurity ($1 \times 10^{15}$ $cm^{-3}$) of the Si substrate. In the case of the electrode formed from the $NiSi_2$ crystal phase at a low temperature, the effective work function Φeff is 4.54 eV, which is smaller than the effective work function Φeff of the NiSi crystal phase electrode (4.66 eV) by 0.12 eV. From this fact, it is understood that the operation threshold voltage can be reduced as compared with the NiSi crystal phase electrode, by use of the $NiSi_2$ crystal phase electrode of the present invention for the n-type MIS transistor. The device can be understood to be operated at a low voltage.

In the present embodiment, at the time of extraction of the effective work function Φeff, the effective work function Φeff is assumed to be extracted by subtracting only fixed electric charges of the interface between $SiO_2$ and the Si substrate from the dependence of Vfb on the thickness of an oxide film. Fixed charges are assumed not to be present in the gate insulation film ($SiO_2$). However, in reality, fixed electric charges are present in a film whose surface density is smaller than the amount of fixed charges in the interface by an order of magnitude or more. The value of the effective work function Φeff extracted by the fixed charges includes an error of the order of about 0.05 eV. However, the effective work function Φeff of the $NiSi_2$ crystal phase remains smaller than that of the NiSi crystal phase.

The gate electrode 6 of the p-type MIS transistor may employ a cubic. $Ni_3Si$ phase or a hexagonal $Ni_{31}Si_{12}$ phase.

Figure 23:
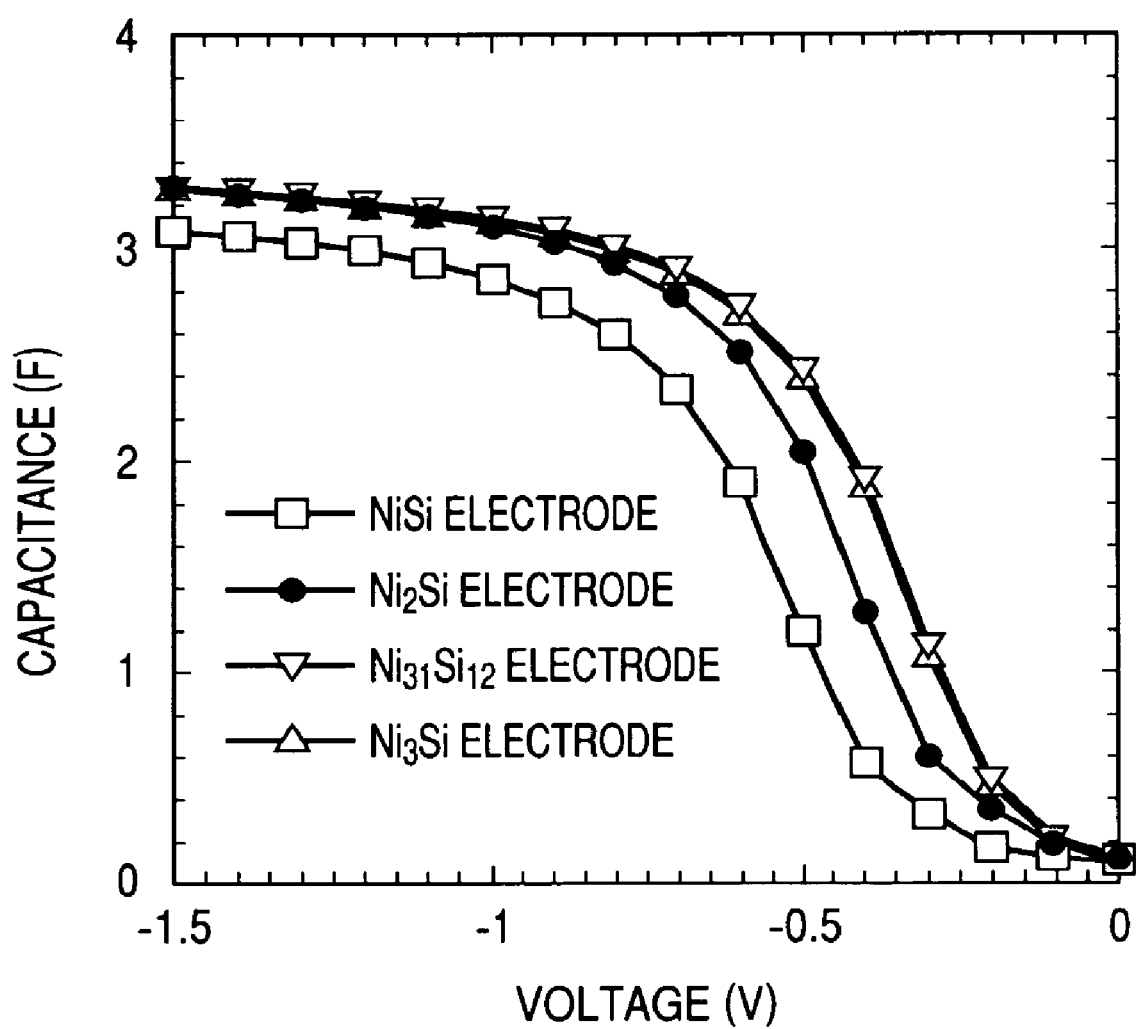
FIG. 23 exemplary shows a capacitance-voltage (C-V) characteristic of the MOS capacitor which uses NiSi, $Ni_2Si$, $Ni_{31}Si_{12}$, and $Ni_3Si$ as gate electrodes.

FIG. 23 shows a capacitance-voltage (C-V) characteristic of a MOS capacitor having a gate electrode of a NiSi crystal phase, a capacitance-voltage (C-V) characteristic of a MOS capacitor having a gate electrode of a $Ni_2Si$ crystal phase, a capacitance-voltage (C-V) characteristic of a MOS capacitor having a gate electrode of a $Ni_{31}Si_{12}$ crystal phase, and a capacitance-voltage (C-V) characteristic of a MOS capacitor having a gate electrode of a $Ni_3Si$ crystal phase.

The employed gate insulation film is $SiO_2$ and has a thickness of 10 nm. The crystal structure of each of the crystal phases is ascertained to be a single phase by XRD analysis. When compared with the case of an NiSi crystal phase electrode, the C-V characteristics of the respective crystal phases shift toward positive voltages. In the case of the orthorhombic $Ni_2Si$ crystal phase electrode, the effective work function Φeff extracted from the dependence of the Vfb voltage on the thickness of the gate insulation film is 4.75 eV. In the case of the hexagonal $Ni_{31}Si_{12}$ crystal phase electrode and the cubic $Ni_3Si$ electrode, the effective work function Φeff extracted from the dependence of the Vfb voltage on the thickness of the gate insulation film is 4.85 eV. Thus, the effective work function Φeff becomes greater with an increase in the Ni composition, to thus approach the valence band of Si. In the p-type MIS transistor, as the value of the effective work function Φeff of the electrode becomes closer to the valence band of Si, the operation threshold voltage can be lower. Accordingly, the device can be operated at a low voltage by use of a gate electrode of Ni silicide having a large Ni composition, and a resultantly-yielded effect becomes greater with an increase in Ni composition. Consequently, as a result of use of the $Ni_3Si$ crystal phase and the $Ni_{31}Si_{12}$ crystal phase for PMOS metal, the operation threshold value can be reduced by 0.2 eV as compared with that achieved by use of the NiSi crystal phase.

When the threshold voltage required by the device is high, an $Ni_2Si$ crystal phase, or the like, may also be employed.

As a result of Ni silicide, whose crystal structure varies according to a conductivity type, being used for the gate electrode, operation voltages for both conductivity types can be reduced, whereby a threshold voltage optimal for a device can be acquired.

The height of each of the gate electrode 5, 6; namely, the thickness of the silicide film, may be 100 nm or less, and the height must be reduced with shortening of the gate length. When the height is too high in relation to the gate length, mechanical strength becomes insufficient, and the structure of the device cannot be maintained during manufacturing processes, there by posing difficulty in manufacture of a device. Typically, the height of the gate electrode may be two to three times the length of the gate. Even when the height is too low, the sheet resistance value required for the gate electrode fails to be attained, which in turn results in deterioration of the characteristic of the device. Therefore, a height required to achieve sheet resistance, which is required according to the generation of the device technology, must be maintained, and at least a height of 20 nm or more is required.

Even in relation to the size of a crystal grain of silicide, the above conditions must be satisfied. Concurrently, in view of variations in effective work function (Φeff), a particle size may be half or less the gate length.

In FIG. 1, a silicon oxide film is used as a gate insulation film. However, an insulation film material (a high dielectric insulation film) whose dielectric constant is higher than that of the silicon oxide film may be employed. For instance, the insulation film material includes $Si_3N_4$, $Al_2O_3$, $Ta_2O_5$, $TiO_2$, $La_2O_5$, $CeO_2$, $ZrO_2$, $HfO_2$, $SrTiO_3$, $Pr_2O_3$, or the like. As in the case of Zr silicate or Hf silicate, a material formed by mixing a silicon oxide with metal ions may be used. Alternatively, a combination of materials, such as LaAl oxide and the like, may be used Material for transistors of respective generations may be appropriately selected and used. Even in the following embodiment, a silicon oxide film is used as the gate insulation film. However, replacing the silicon oxide film with a high dielectric insulation film may be applied unless otherwise specified.

The gate insulation layer may include a layer including an Hf element, because the operation threshold voltage can be lowered further.

In this case, the effect of modulation of the effective work function $\Phi eff$ yielded as a result of formation of the $NiSi_2$ crystal phase becomes further greater. As a result of the $NiSi_2$ crystal phase formed at a low temperature being used for the NMOS gate electrode, the effective work function $\Phi eff$ assumes a value of 4.3 eV, so that the threshold voltage can be lowered further. This is attributable to Fermi-level pinning which is induced by Hf—Si bond arising in the interface between the electrode and an Hf-based insulation film. As the Si composition of the electrode-side interface becomes greater, the influence of pinning becomes greater.

Figure 34:
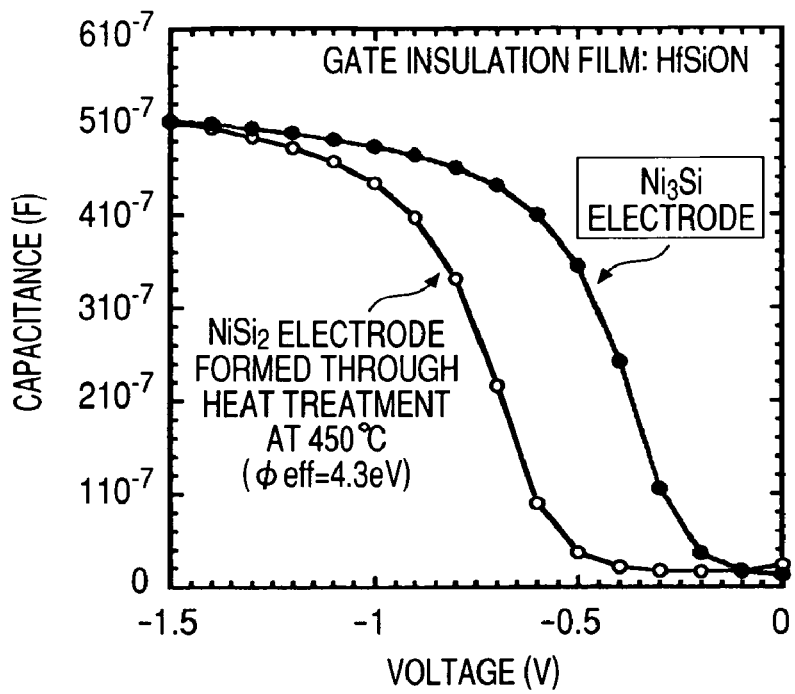
FIG. 34 is an exemplary diagram showing a capacitance-voltage (C-V) characteristic where $NiSi_2$ is formed on N-doped silicate gate insulation film (HfSiON) and another capacitance-voltage (C-V) characteristic where $Ni_3Si$ is formed on the N-doped silicate gate insulation film (HfSiON)

FIG. 34 is an exemplary diagram showing a capacitance-voltage (C-V) characteristic where $NiSi_2$ is formed on N-doped silicate gate insulation film (HfSiON) and another capacitance-voltage (C-V) characteristic where $Ni_3Si$ is formed on the N-doped silicate gate insulation film (HfSiON). As shown in FIG. 34, a shift amount (width) of the characteristic is larger than that of the characteristic (on $SiO_2$) shown in FIG. 23 so that an effective work function $\Phi eff$ can be small by using NiSi2 grain phase on HfSiON.

In the case of the $NiSi_2$ crystal phase/Hf-based insulation film, the surface density of Si in the $NiSi_2$ crystal phase is the same as the surface density of polycrystalline Si, and hence an Hf—Si bond is formed at the same surface density. Specifically, in the case of the $NiSi_2$ electrode, Fermi-level pinning which is as strong as that achieved in the case of polycrystalline Si arises on $SiO_2$, and the effective work function has become smaller to only 4.54 eV. In contrast, on HfSiON, variations in work function greatly drop to 4.3 eV as in the case of polycrystalline Si.

This phenomenon becomes especially noticeable when the Hf composition is 30% or more. However, even when the Hf composition is smaller than 30%, the work function is affected by the pinning phenomenon, so long as the Hf—Si bond is present in the interface. The effective work function $\Phi eff$ changes from 4.54 eV (on $SiO_2$) to 4.3 eV (on HfSiON) according to the surface density of the Hf—Si bond in the interface.

In contrast, in the case of the orthorhombic MnP-type NiSi phase, the surface density of Si on the electrode side is about one-half that achieved in the case of $NiSi_2$. Therefore, even in the case of an insulation film having the same Hf composition, a pinning rate is half that achieved in the case of $NiSi_2$, and a drop in effective work function $\Phi eff$ is small.

In the case of the $Ni_3Si$ phase electrode having great Ni content appropriate for PMOS metal, the amount of Si in the interface becomes smaller, and the influence of pinning becomes smaller. In the case of the $Ni_3Si$ phase electrode, a difference between the effective work function $\Phi eff$ achieved on $SiO_2$ and the effective work function $\Phi eff$ achieved on the $Ni_3Si$ phase electrode is 0.1 eV or less. Thus, an effective work function $\Phi eff$ essentially the same as that achieved on $SiO_2$ is realized. The $Ni_{31}Si_{12}$ phase exhibits essentially the same behavior. Consequently, in a case where the $NiSi_2$ crystal phase is used for NMOS metal and where the $Ni_3Si$ crystal phase and the $Ni_{31}Si_{12}$ phase are used for PMOS metal, when the gate insulation layer including Hf elements is used, a particular decrease in the threshold voltages for respective conductivity types can be achieved.

Using HfSiON, which is amorphous, for the gate insulation layer may be used.

The gate insulation layer may have an interface layer which is formed from $SiO_2$ and provided on the substrate side of the gate insulation layer. The gate insulation layer may have an interface layer which formed from $SiO_2$, SiON, SiN, or the like and provided on the gate electrode side of the gate insulation layer. When the interface layer is formed on the gate electrode side of the gate insulation layer, the work function decrease effect of $NiSi_2$ due to the Fermi-level pinning phenomenon due to the Hf—Si bond becomes smaller with increasing thickness of the interface layer. From the practical viewpoint, the thickness of the interface may be 5 angstroms or less.

According to the embodiment, a work function which is superior in a decrease in the threshold voltage of a transistor fabricated on the bulk substrate can be fulfilled. Hence, as shown in FIG. 1, the substrate may be a bulk substrate.

Here, Si is used for the channel region. However, SiGe, Ge, and strained silicon, which are greater than Si in terms of mobility, may also be used.

First Embodiment

Manufacturing Method: Implanting Ni ions into an Upper Portion of the Gate

Figure 3:
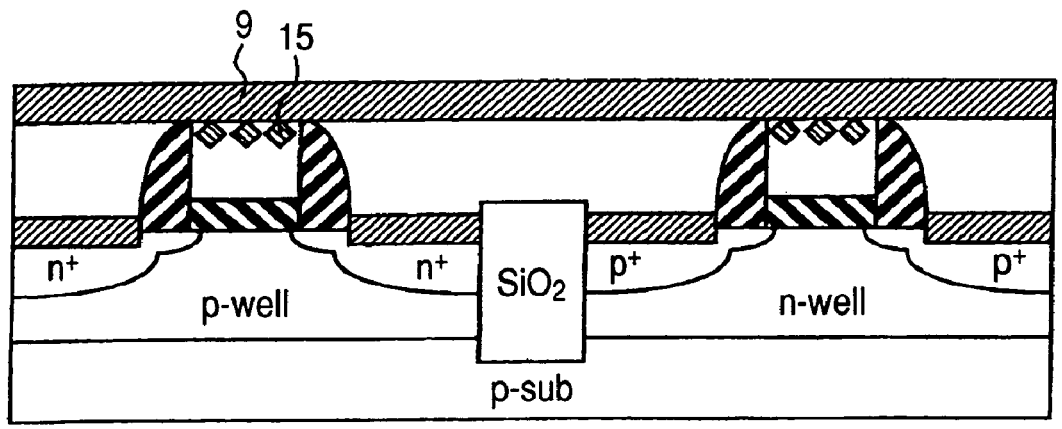
FIG. 3 is an exemplary diagrammatic cross-sectional view in the direction of gate length, showing a process for manufacturing the CMOSFET of the first embodiment subsequent to the process shown in FIG. 2.
Figure 4:
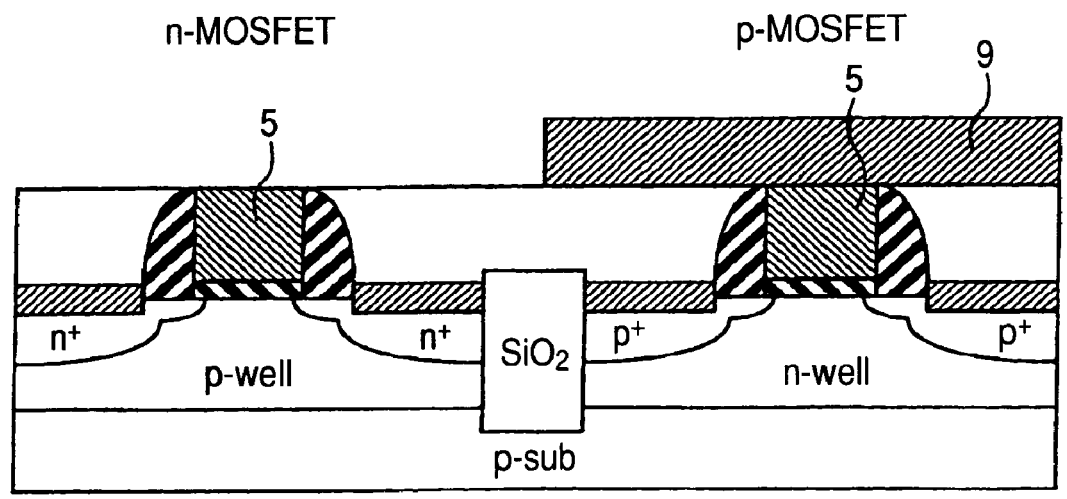
FIG. 4 is an exemplary diagrammatic cross-sectional view in the direction of gate length, showing a process for manufacturing the CMOSFET of the first embodiment subsequent to the process shown in FIG. 3.

An example method for manufacturing the semiconductor device of the first embodiment will be described by reference to FIGS. 2 to 4.

A device isolation structure can be formed by a local oxidation method or a shallow trench method and may also be of mesa type. Subsequently, a p-type impurity region (a p-well) and an n-type impurity region (an n-well) are formed by ion implantation.

Next, a thermal oxidation silicon film, which is to be used as a gate insulation film, is formed on the surface of the silicon substrate. When a high dielectric film is used for the gate insulation film, a metal oxide formed by the MOCVD method or the ALD method, or such a metal oxide doped with Si, N, or the like, is used in place of the silicon.

Subsequently, a polycrystalline silicon layer used as a gate electrode is deposited to 50 nm, and a SiN cap layer is deposited thereon to 10 nm by decompression CVD. Patterning is performed by lithography, and the shape of the gate electrode is processed by anisotropic etching.

A heavily-doped shallow source-drain region (an extension region) in each of the n-type MIS transistor and the p-type MIS transistor is formed by implantation of phosphor ions and boron ions. An elevated source-drain structure, which uses the selective epitaxial growth method and can inhibit a short-channel effect as a device characteristic, may also be used for forming the source-drain diffused layer. Concurrently with formation of the elevated source-drain region, impurities may also be introduced.

A sidewall used for isolating the gate electrode from the source-drain region is formed. Phosphor ions and boron ions are implanted at an acceleration voltage which is greater than the previously-employed acceleration voltage, to thus form a deep source-drain junction region. Ni is formed to 8 nm by sputtering, and the thus-formed film is subjected to heat treatment at 400° C., thereby forming an NiSi contact layer in an upper portion of the source-drain region. Unreacted Ni in the other region is selectively etched away by an $H_2SO_4$ solution, to thus selectively form NiSi in only the source-drain region.

Next, the SiN cap layer on the gate electrode is removed, and a silicon oxide film of an interlayer film is deposited by decompression CVD, and the upper edge of the gate electrode is exposed by CMP (Chemical-Mechanical Polishing).

Figure 2:
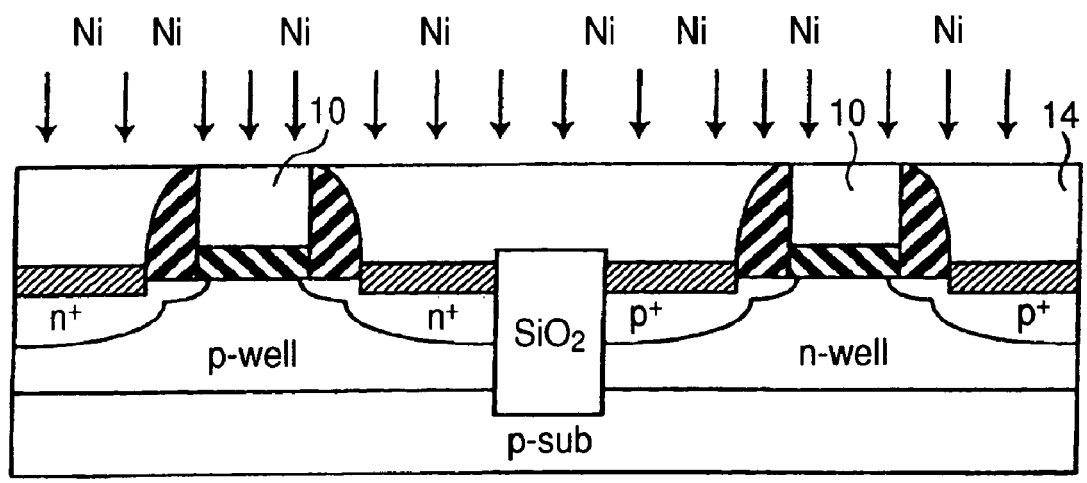
FIG. 2 is an exemplary diagrammatic cross-sectional view in the direction of gate length, showing an example process of manufacturing the CMOSFET of the first embodiment.

As shown in FIG. 2, Ni ions are implanted while the upper portions of the polycrystalline Si gate electrodes of both conductivity types remain exposed. The acceleration voltage is 10 keV, and the amount of ions to be implanted is $5 \times 10^{15}$ $cm^{-2}$ or more. Subsequently, the gate electrode is subjected to heat treatment for one hour at 400° C., whereby a cubic $NiSi_2$ crystal bulk of 10 nm or thereabouts is formed on the upper portion of the polycrystalline Si gate electrode.

As mentioned above, Ni ions are implanted into amorphous Si, and a crystal seed of $NiSi_2$ phase is known to be formed through subsequent heat treatment (see Non-Patent Document 4) In this case, long-hour heat treatment, which is as long as three hours, is employed for forming the $NiSi_2$ crystal seed from amorphous Si. Applying this method to the processes of manufacturing an LSI is not effective in terms of production efficiency.

According to the manufacturing method of the present embodiment, the time for heat treatment can be shortened by implanting Ni ions into a polycrystalline. The reason for this is that the $NiSi_2$ crystal phase and Si have the same cubic lattice structure and that a difference of 1% or less exists between the lattice constant of the $NiSi_2$ crystal phase and the lattice constant of Si, and they are very close to each other. At the time of formation of the $NiSi_2$ crystal phase, a seed for growth can be formed while taking polycrystalline Si of essentially-identical lattice structure as the point of origin. Hence, the activation energy required to form a seed of $NiSi_2$ becomes smaller. Formation of a crystal seed is more likely to arise in a grain boundary which is more structurally unstable rather than in Si crystal grains. Further, formation of a crystal seed is more accelerated by a triple point in the crystal grains. Specifically, energy becomes unstable at a point where a larger number of crystal grains overlap, and formation of a $NiSi_2$ crystal seed is accelerated. Therefore, the present embodiment where Ni ions are implanted into polycrystalline Si is more suitable for formation of crystal grains of $NiSi_2$ crystal phase in a shorter period of time.

Ni is grown to a film of 20 nm by sputtering. Subsequently, the film is subjected to low-temperature heat treatment at 500° C., whereby an $NiSi_2$ crystal phase grows while taking the $NiSi_2$ bulk, which has already been formed, as a seed for growth. The $NiSi_2$ crystal phase is formed at the gate electrodes of both conductivity types up to the interface of the gate insulation film (FIG. 3).

After removal of unreacted Ni from the device isolation $SiO_2$, only the p-type MIS transistor formed region is exposed by lithography, and the n-type MIS transistor region is coated with a resist or a hard mask. Subsequently, Ni is again grown to a film of 50 nm by sputtering (FIG. 4), and the film is subjected to heat treatment at 400° C., thereby forming only the gate electrode $Ni_3Si$ of the p-type MIS transistor. Thus, the structure of the first embodiment can be manufactured (FIG. 1).

According to the manufacturing method (FIGS. 2 to 4, and FIG. 1), a mixed crystal phase of $NiSi+NiSi_2$, such as that described in connection with K. Takahashi et al., is not formed on the interface of the gate insulation film unless the deposited film of the Ni layer 9 is made larger in thickness than one-half the film of the polycrystalline Si layer 10. The reason for this is that, under the present manufacturing method, crystal of $NiSi_2$ phase, which is negatively larger than the orthorhombic MnP-type NiSi in terms of heat of formation; namely, a stable phase, is formed in advance, and the orthorhombic MnP-type NiSi, which is more unstable, is not formed. The heat generated by the crystal of NiSi is 21.4 kcal/mol, and the heat generated by the crystal of $NiSi_2$ is 22.5 kcal/mol.

When Si used for $NiSi_2$ in the vicinity of the interface is not sufficient with respect to the amount of Ni; namely, when Ni which is greater than one-half the height of the polycrystalline Si gate has been deposited, the phase that is finally formed is determined by the Ni—Si composition. For this reason, NiSi is formed in some portions, and variations in the effective work function Φeff of the electrode become greater than 0.05 eV, as mentioned previously.

When the thickness of a deposited film of the Ni layer 9 is made smaller than 5/18 the thickness of the polycrystalline Si layer 10, the thus formed $NiSi_2$ phase does not reach the interface of the gate insulation film, and the polycrystalline Si layer, which has not yet undergone silicidizing reaction, remains on the interface of the gate insulation film. Therefore, formation of a metal gate electrode, which is the object of the present invention, cannot be achieved.

Consequently, the thickness of a deposited film of an Ni layer may be 5/18 to ½ the thickness of the polycrystalline Si layer.

The heat treatment process for generating an $NiSi_2$ crystal nucleus in the polycrystalline silicon layer requires a temperature ranging from 300° C. to 800° C. When the temperature is lower than 300° C., the $NiSi_2$ crystal nucleus fails to be formed. In contrast, when the temperature is higher than 800° C., a steep impurity profile of a heavily-doped impurity layer formed in the source drain region cannot be maintained, which in turn leads to deterioration of the ON-OFF characteristic of the device.

Although the heat treatment process depends on temperature as well, the heat treatment process may be performed from 10 seconds to one hour. When the process is performed longer than one hour, there may arise a fear of an increase in manufacturing cost in terms of productivity. When the process is performed less than 10 seconds, there may arise a fear of an $NiSi_2$ crystal nucleus failing to sufficiently grow in some devices.

The atmosphere of the heat treatment process may be a nitrogen atmosphere.

The heat treatment process for causing the $NiSi_2$ crystal nucleus to grow and to transform the polycrystalline silicon layer into the $NiSi_2$ crystal phase requires a temperature from 300° C. to 600° C. When the temperature is lower than 300° C., the growth rate of crystal grains is low, which in turn increases production cost. In contrast, when the temperature is higher than 600° C., the formed $NiSi_2$ phase inflicts damage to the gate insulation film, which in turn deteriorates the reliability of the device.

Although the heat treatment process depends on temperature as well, the heat treatment process may be performed for one hour or less. If the process is performed longer than one hour, manufacturing cost is increased in terms of productivity.

The atmosphere of the heat treatment process may be a nitrogen atmosphere.

Second Embodiment

Impurity-Segregated Layer

Differences between an example CMOSFET according to a second embodiment and the CMOSFET of the first embodiment will be described by reference to FIG. 5.

Figure 5:
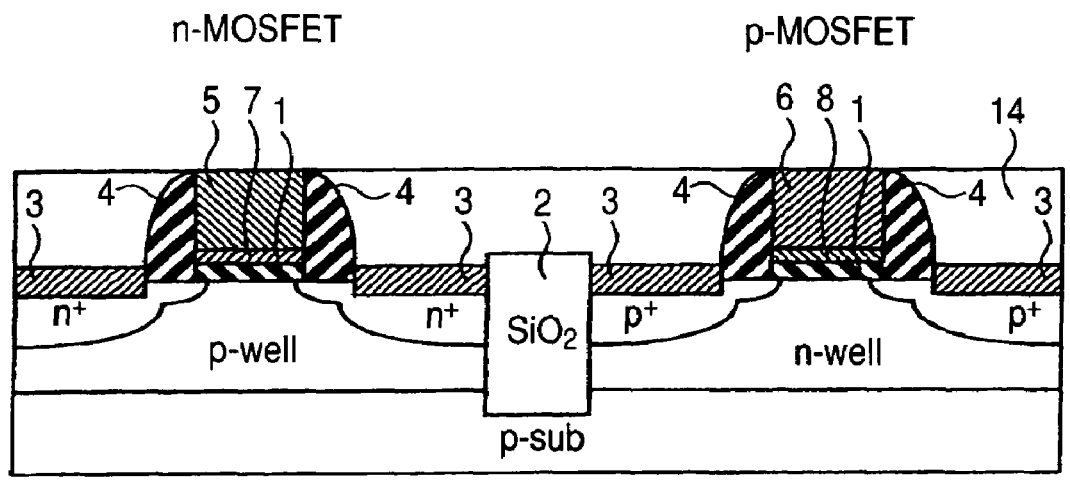
FIG. 5 is an exemplary diagrammatic cross-sectional view in the direction of gate length, showing an example CMOSFET according to a second embodiment.

FIG. 5 is a cross-sectional schematic view of the example CMOSFET of the second embodiment in the direction of gate length.

As shown in FIG. 5, a structural difference between the CMOSFET shown in FIG. 5 and that shown in FIG. 1 lies in that one layer or less, which is doped with impurities, is present on the interface between the gate electrode and the gate insulation film in relation to the gate electrodes of both conductivity types. P is unevenly distributed in at least the first layer within the interface region between the gate electrode 5 and the gate insulation layer 1 of the n-type MIS transistor, and the concentration of P is smaller than $1 \times 10^{16}$ cm$^{-2}$. B (boron) is unevenly distributed in the interface region between the gate electrode 6 and the gate insulation layer 1 of the p-type MIS transistor, and the concentration of B is smaller than $1 \times 10^{16}$ cm$^{-2}$.

P is unevenly distributed to on the part, facing the electrode 5, of the interface between the gate electrode 5 and the gate insulation layer 1 of the n-type MIS-transistor, to thus form an electrical dipole which induces positive charges on the part, facing the gate insulation film, of the interface. The effective work function Φeff continuously decreases with an increase in the concentration of P. However, the continuous decrease of the effective work function Φeff is for the case where the surface density of P forms one layer or less. The modulation effect becomes saturated when the surface density has exceeded one layer. The reason for this is that the modulation effect of Φeff is attributable to formation of an interface dipole.

Figure 35:
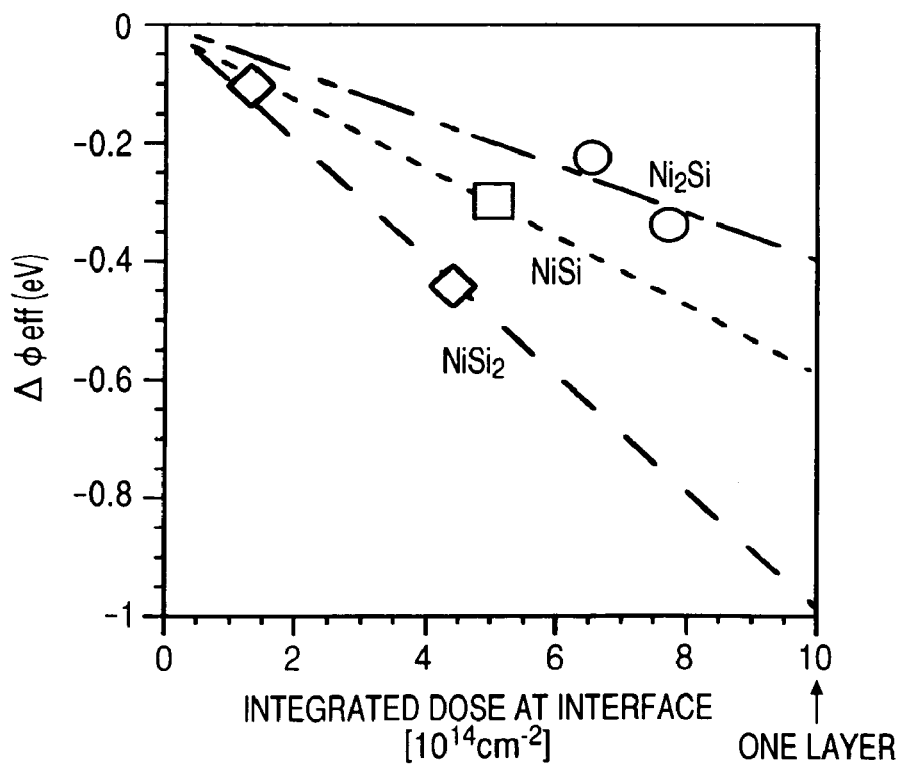
FIG. 35 is an exemplary diagram showing a relationship between modulation amount of effective work function Φeff and a density of impurity on an interface in case that P is unevenly distributed to on an interface by ion implantation of doping an impurity in each gate electrode composed of Ni—Si after silicide electrode is formed.

FIG. 35 is an exemplary diagram showing a relationship between modulation amount of effective work function Φeff and a density of impurity on an interface in case that P is unevenly distributed to on an interface by ion implantation of doping an impurity in each gate electrode composed of Ni—Si after silicide electrode is formed. The density of impurity is quantitatively evaluated by SIMS analysis. The effective of the modulation of NiSi2 electrode due to the impurity is larger that of NiSi or Ni2Si, so that the modulation width of the effective work function Φeff due to P can be a maximum of about 1.0 eV (for a case where a P-segregated layer forms one layer). Therefore, the effective work function Φeff of the gate electrode of the n-type MIS transistor having the NiSi$_2$ structure as a result of segregation of P on the interface becomes smaller by an interface uneven distributed amount $4.5 \times 10^{14}$ cm$^{-2}$ than that achieved when P is not present (NiSi$_2$: 4.54 eV), whereby the effective work function Φeff corresponding to the edge (Ec) of a conduction band of Si is implemented. Specifically, a minimum of 4.15 eV is achieved. This value corresponds to the value of Φeff of the gate electrode optimal to a bulk-type high-speed-operation n-type MIS transistor.

Figure 6:
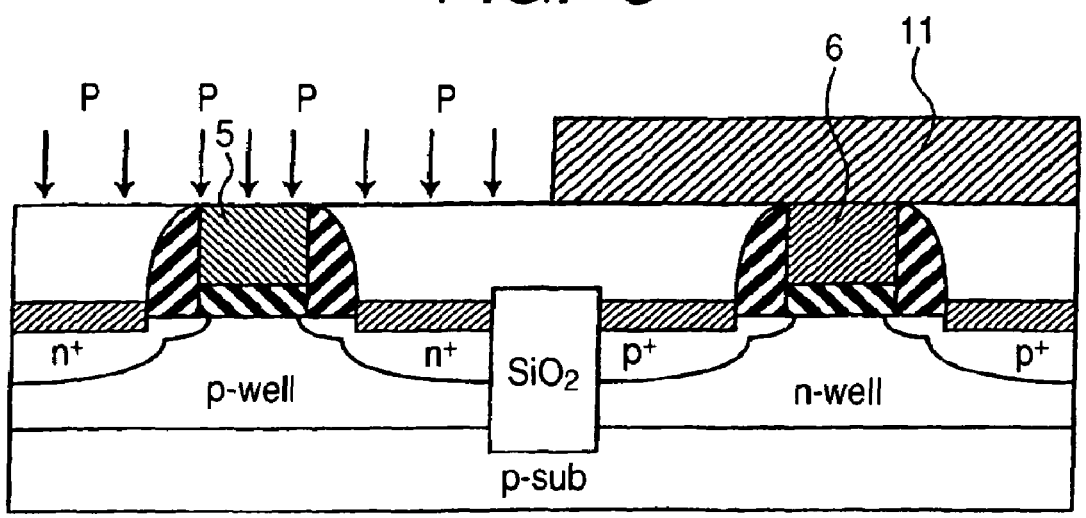
FIG. 6 is an exemplary diagrammatic cross-sectional view in the direction of gate length, showing an example process of manufacturing the CMOSFET of the second embodiment.
Figure 7:
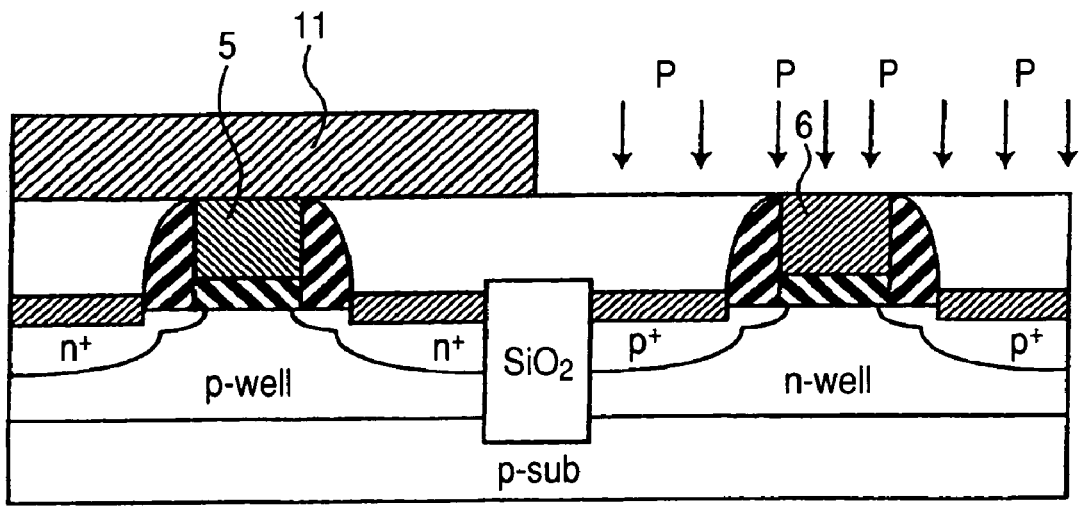
FIG. 7 is an exemplary diagrammatic cross-sectional view in the direction of gate length, showing a process for manufacturing the CMOSFET of the second embodiment subsequent to the process shown in FIG. 6.
Figure 33:
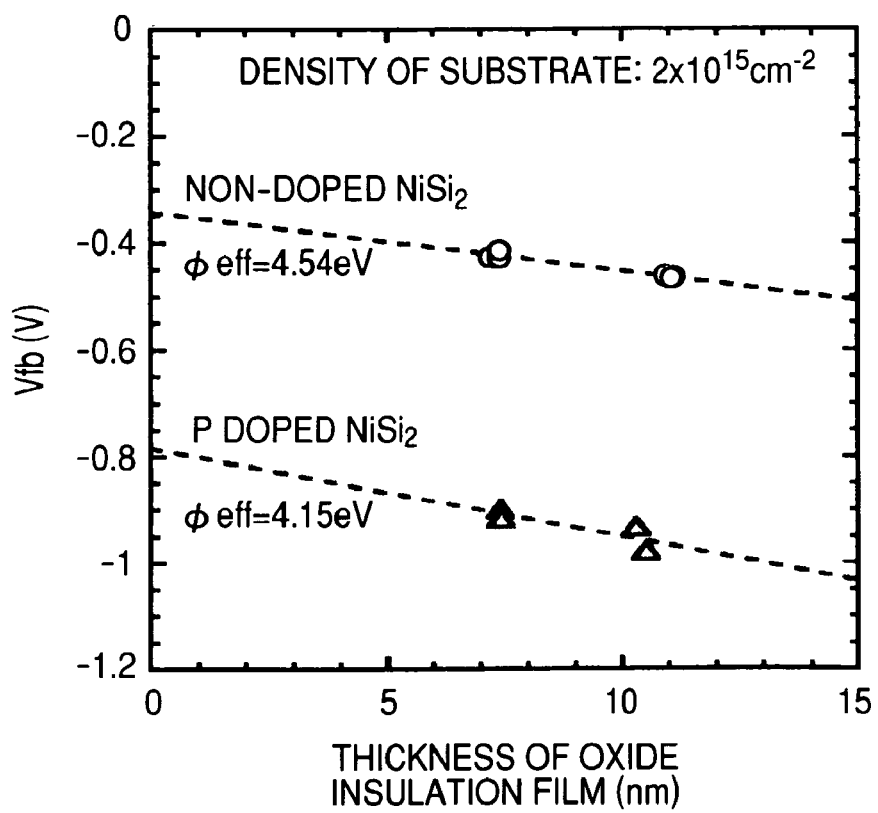
FIG. 33 is an exemplary diagram showing an oxide-film dependent property of $V_{fb}$ calculated from a capacitance-voltage (C-V) characteristic of gate electrode of n-type MIS transistor according to the second embodiment.

FIG. 33 is an exemplary diagram showing an oxide-film dependent property of $V_{fb}$ calculated from a capacitance-voltage (C-V) characteristic of gate electrode of n-type MIS transistor according to the second embodiment. A work function of NiSi2 is 4.54 ev without doping P. However, the work function of NiSi2 is 4.15 eV when P is doped by ion implantation as shown in FIGS. 6 and 7. The ion implantation will be described later.

Meanwhile, in the p-type MIS transistor, as a result of B being segregated on the interface, the Φeff value becomes greater, by a maximum of 0.4 eV, than the Φeff (4.85 eV) of Ni$_3$Si, which is achieved when B is not unevenly distributed. The reason for this is that the interface dipole is modulated in a direction opposite that achieved in the case of P. Another reason is that the segregated position of P is on the electrode side of the interface between the electrode and the gate insulation film; and that B is segregated on the part, facing the gate insulation layer 1, of the interface. In relation to the distribution of electric charges in the interface, when compared with the case where the gate electrode is not doped, the negative electric charges are induced on the part, facing the gate insulation film, of the interface by the B elements segregated in the first layer of the insulation-film-side of the interface, thereby forming a dipole oriented in the opposite direction. As a result, the effective work function Φeff corresponding to the end (Ev) of the valence band of Si is fulfilled. As in the case of segregation of P, the amount of modulation of Φeff increases in proportion to the surface density of B on the interface within the region where B forms one layer or less. When B has formed one layer, the effect becomes saturated. The maximum amount of modulation is 0.4 eV or thereabouts, and the effective work function Φeff increases up to 5.25 eV. This value of the effective work function Φeff is essentially the same as that achieved by the heavily-doped p-type polycrystalline Si electrode, and is the value of the effective work function Φeff optimal for a bulk-type high-speed operation p-type MIS transistor. When the previously-described HfSiON film or HfO$_2$ is used as the gate insulation film, any of these impurities diffuses in large amounts into the insulation film and is not segregated on the interface. Hence, the above-mentioned impurity modulation effect cannot be obtained. The SiO$_2$ interface layer is placed in the upper portion of the HfSiON layer, whereby impurities are segregated on the interface between the gate electrode and the interface layer, and the modulation effect due to impurities is obtained.

When the CMIS device simultaneously has the gate electrode structures of both conductivity types, high-speed operation of the CMIS device becomes possible. It is better to adjust doping levels of P and B in accordance with the operation threshold voltage required by the device. For instance, in the case of a low-power-consumption device, there is a necessity for increasing a threshold voltage and decreasing an OFF leakage current. Therefore, the doping level of impurities in the interface must be set to a low level.

Elements used for doping the interface between the gate electrode and the insulation film are not limited to P and B. When non-metal elements whose electronegativity is greater than that of Ni and that of Si are used, control of the work function performed by addition of impurities is further facilitated. Especially, Sb and As are segregated on the part, facing the gate electrode, of the interface, and yield a large effect of decreasing the effective work function Φeff, as in the case of P. Sb and As are additional elements suitable for an n-type transistor.

Even when the additional impurities are segregated on the second layer or subsequent layers on the same side of the interface, the influence of segregation on the modulation effect is small. When the impurities are segregated on the electrode-side of the interface, the impurities are blocked by free electrons of the electrode. Even when the impurities are segregated on the insulation-film-side of the interface, electrical dipoles are isotropically formed, and the dipoles cancel each other. Meanwhile, when identical elements are segregated on the respective sides of the interface, the effects of the resultant dipoles cancel each other, whereupon the modulation effect of the effective work function Φeff becomes smaller.

In the case of any of the elements, the segregation coefficient of the element achieved in Ni silicide differs from the segregation coefficient of the element achieved in the gate insulation film. The elements are chiefly segregated in either the Ni silicide or the gate insulation film, and a value close to the previously-described maximum modulation width is obtained. Further, the additional elements are doped in the matrix of an electrode material or the matrix of an insulation film material. A layered structure having the property of a bulk of additional impurity elements should never be acquired. Typically, the additional elements may be formed into five or fewer monolayers. The reason for this is that, in the case of five monolayers or more, the additional elements do not exhibit the effect of the dipole; and that the effective work function Φeff is determined by a vacuum work function of the additional element layer, which is beyond the gist of the present invention.

A low-acceleration SIMS analysis method, which is applied to a substrate side, or photoelectron spectroscopy (XPS), is effective as the technique for measuring surface density of the segregated impurities. Especially, the status of impurities can be clarified by use of XPS, so that a determination can be made as to whether the impurities are distributed in a gate electrode or in the insulation film.

Figure 36:
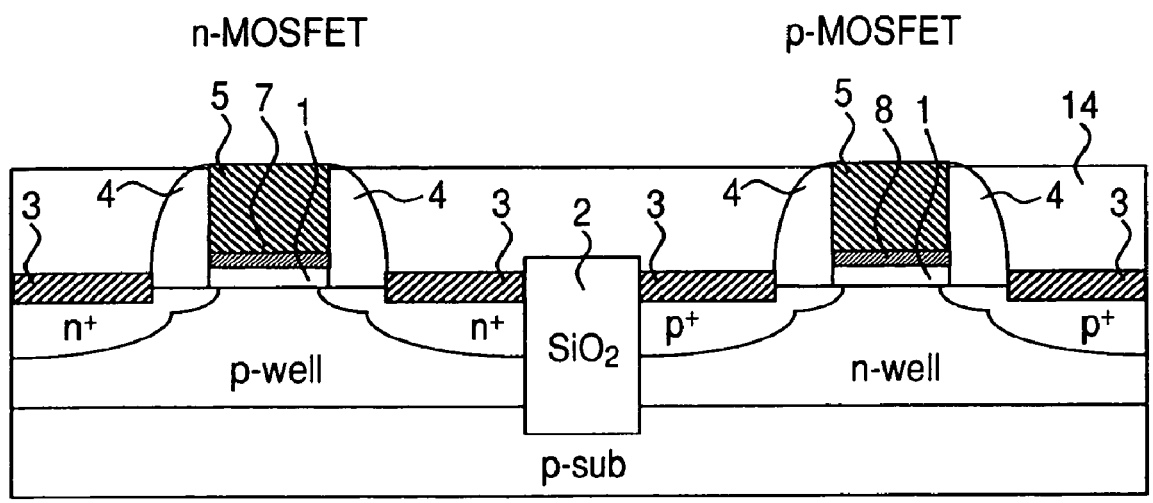
FIG. 36 is an exemplary diagrammatic cross-sectional view of another example of CMOSFET according to the second embodiment in the direction of gate length.

As shown in FIG. 36, a predetermined effective work function Φeff can be obtained even though B is segregated on the interface in a gate electrode of p-type MIS transistor by using NiSi$_2$ phase as well as n-type MIS transistor, since, as shown in FIG. 35, modulation effective is large in NiSi$_2$ due to the effective of segregated impurities. When a density of B segregated on an insulation film side of the interface is adjusted to be about $6.5 \times 10^{14}$ cm$^{-2}$, the predetermined effective work function Φeff can be 5.2 eV, and a high-speed operation of the p-type transistor with low-threshold value can be made. Accordingly, CMIS device can operate at high-speed. As shown in FIG. 35, when the impurity density on the interface is larger, the effective work function Φeff becomes minus. However, in case that the impurities (for example, B) are segregated on gate insulation film side of the interface, the code of the effective work function is inverted. Accordingly, the larger the value of the effective work function Φeff is, the larger the impurity density-on the interface is.

Second Embodiment

Manufacturing Method 1: Snow-Plow Method

Differences between one example process for manufacturing the semiconductor device of the second embodiment and the process for manufacturing the semiconductor device of the first embodiment will be described.

An example technique for forming the P-segregated layer and the B-segregated layer will be described. First, B or P impurities are also introduced simultaneously into the gate electrode during the ion implantation operation, which is performed for formation of the source-drain regions, without use of an SiN cap on the gate electrode. Subsequently, by the "snow-plow effect" achieved during a silicidation reaction, the impurities are segregated on the part, facing the gate electrode, of the interface.

Any conditions may be employed as the conditions for ion implantation, so long as the conditions conform to those employed in the case of implantation of ions into the Ni silicide electrode and infliction of damage to the gate insulation layer can be avoided.

Second Embodiment

Manufacturing Method 2: Ion Implantation Method

Differences between another example process for manufacturing the semiconductor device of the second embodiment and the process for manufacturing the semiconductor device of the first embodiment will be described, by reference to FIGS. 6 and 7.

Subsequent to the process shown in FIG. 1, P is implanted at 5 keV to a concentration of $1 \times 10^{16}$ cm$^{-2}$ while only the region—where the n-type MIS transistor is fabricated—is exposed, (FIG. 6). By the same method, B is implanted at 1 keV to a concentration of $1 \times 10^{16}$ cm$^{-2}$ while only the region—where the p-type MIS transistor is fabricated—is exposed (FIG. 7).

Subsequently, P and B, which have been implanted into the respective gate electrodes 5, 6 by one-hour heat treatment at 500° C., diffuse a grain boundary of the polycrystallineline Ni silicide layer, and are segregated on the interface of the gate insulation film 1. Thus, the structure shown in FIG. 5 can be manufactured.

Conditions for implanting B and P ions into the gate electrode are not limited to those mentioned above. Arbitrary conditions may alternatively be employed, so long as the acceleration voltage has lowered to such an extent that no damage is inflicted on the gate insulation film by ion radiation. Alternatively, ion implantation and heat treatment may be performed while being separated into multistages. The essential requirement for a typical acceleration voltage used for implanting ions is to fulfill conditions of an average distance range of ions falling into a region from the upper edge of the gate electrode to two-thirds the height of the gate. Further, the essential requirement for heat treatment is also to fulfill conditions of implanted elements sufficiently diffusing to the interface between the electrode and the gate insulation film according to the depth of implantation.

The temperature of heat treatment may range from 300° C. to 500° C. When the temperature is lower than 300° C., the diffusion rate of Ni is slow, and sufficient diffusion of Ni involves consumption of much time, thereby deteriorating productivity. The temperature never exceeds 600° C. If the temperature exceeds 600° C., Ni diffuses into the gate insulation film, thereby increasing a gate leakage current. In an extreme case, a short circuit arises between the gate electrode and the channel region.

Depending on the heat of heat treatment, the heat treatment process may be performed within the range of 10 seconds to one hour. If the heat treatment is performed longer than one hour, productivity will be deteriorated, and manufacturing cost may be increased. In contrast, when the heat treatment is performed shorter than 10 seconds, there may arise a fear of NiSi$_2$ crystal nucleus failing to sufficiently grow in some devices.

The atmosphere of the heat treatment process may be a nitrogen atmosphere.

The rate at which B diffuses into the Ni silicide film by way of the grain boundary is 10 times or more the rate at which B diffuses into the polycrystalline Si. For this reason, in relation to formation of an interfacial segregated layer of B, when ion implantation is employed after formation of Ni$_3$Si, B is efficiently segregated on the interface, and the amount of Φeff modulation becomes greater.

Third Embodiment

TiSi$_2$ Upper Layer

Differences between an example CMOSFET according to a third embodiment and that of the second embodiment will be described by reference to FIG. 8.

Figure 8:
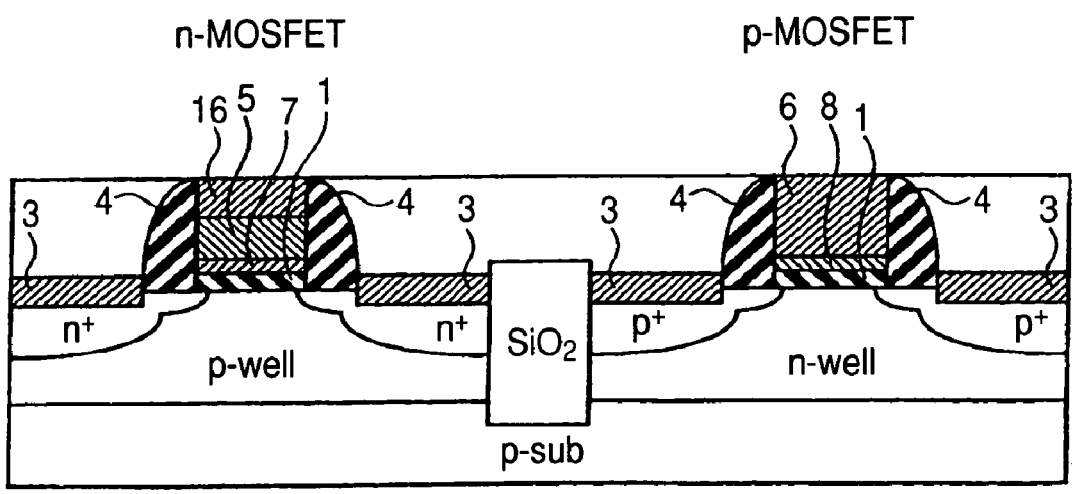
FIG. 8 is an exemplary diagrammatic cross-sectional view in the direction of gate length, showing an example CMOSFET according to a third embodiment.

FIG. 8 is a cross-sectional schematic view of the example CMOSFET of the third embodiment in the direction of gate length.

As shown in FIG. 8, the structural difference between the CMOSFET of the present embodiment and its counterpart shown in FIG. 5 lies in the structure of a gate electrode of the n-type MIS transistor. In other respects, the CMOSFET is structurally identical with its counterpart shown in FIG. 5. In relation to the structure of the electrode of the n-type MIS transistor, a lower layer on the part, facing the gate insulation film, of the interface is formed from a polycrystallineline layer (a cubic NiSi$_2$ crystal phase) where each of crystal grains has a cubic crystal structure and a 1:2 Ni—Si composition, and an upper layer of the same is formed from an orthorhombic TiSi$_2$ crystal phase of C49 type. The crystal structure of the gate electrode is orthorhombic C49 type. P is unevenly distributed over the interface between the NiSi$_2$ layer and the gate insulation film, as in the case of the embodiment shown in FIG. 5.

According to this structure, the structure of the interface between the gate electrode and the gate insulation film is analogous to that described in connection with the second embodiment, and yields the same advantage as that yielded by the second embodiment. Details are described in connection with the manufacturing method. However, the structure of the gate electrode of the present embodiment can also be manufactured through the heat process for forming silicide at 500° C. or less, and the reliability of the device is not impaired.

The thickness of the TiSi$_2$ crystal phase layer may range from 4.6 nm to 24 nm. As will be described later, when a Ti thin layer is formed within the above-thickness range, the TiSi$_2$ crystal phase assumes a thickness falling within this range.

In FIG. 8, impurity segregated layers 7, 8 are formed in response to the second embodiment. However, in the third embodiment and all embodiments described hereinafter, these layers may be omitted as in the case of the first embodiment.

Third Embodiment

Manufacturing Method: Insertion of Ti Thin Layer

Figure 9:
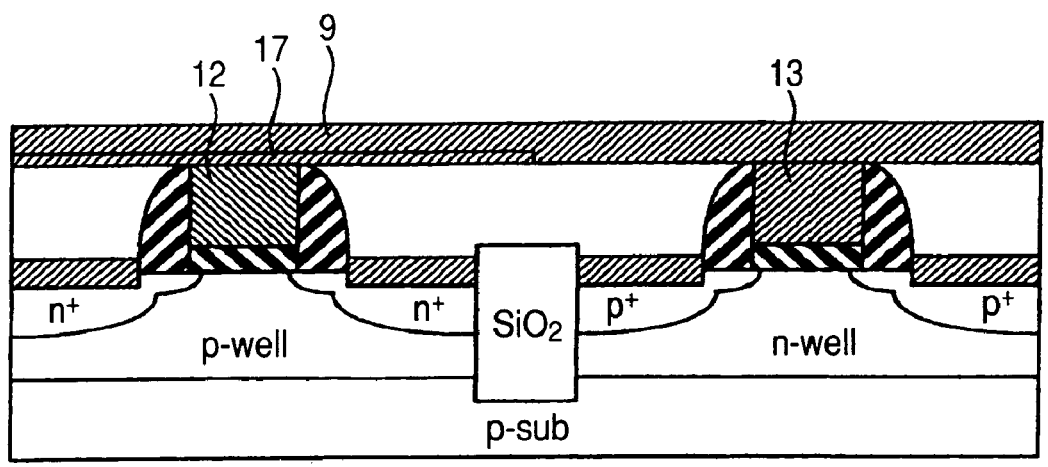
FIG. 9 is an exemplary diagrammatic cross-sectional view in the direction of gate length, showing an example process of manufacturing the CMOSFET of the third embodiment.

An example method for manufacturing a semiconductor device of the third embodiment will be described by reference to FIGS. 9 and 10.

The method is the same as the method described in connection with First Embodiment—Manufacturing Method up to the process of exposing the upper end of the gate electrode by CMP (Chemical-Mechanical Polishing). In the present embodiment, the SiN cap layer is not formed on the gate electrode. During implantation of P or B ions into the source-drain region, P ions are simultaneously introduced into the gate electrode for the case of the n-type MIS transistor, as well; and B ions are simultaneously introduced into the gate electrode for the case of the p-type MIS transistor.

A Ti layer having a thickness of 4 nm is formed in only the n-type MIS transistor region by lithography. Subsequently, as shown in FIG. 9, Ni is caused to grow to 15 nm by sputtering while upper portions of the polycrystalline Si gate electrodes of both conductivity types are exposed.

Subsequently, the gate electrode of the n-type MIS transistor is subjected to a heat treatment process for one minute at 450° C., a polycrystallineline layer of cubic NiSi$_2$ crystal phase is formed immediately above the gate insulation film, and an orthorhombic TiSi$_2$ crystal phase of C49 type is formed on the polycrystallineline layer to about 8 nm. A polycrystalline line layer of NiSi is formed on the gate electrode in the p-type MIS transistor region to a thickness of 30 nm, and the polycrystalline Si layer is formed below the polycrystallineline layer of NiSi so as to contact the gate insulation film over an area of about 20 nm. At this time, P and B elements in the polycrystalline Si layer are segregated on the interface of the gate insulation film and on the interface between NiSi and polycrystalline Si by the "Snow Plow" effect.

Figure 10:
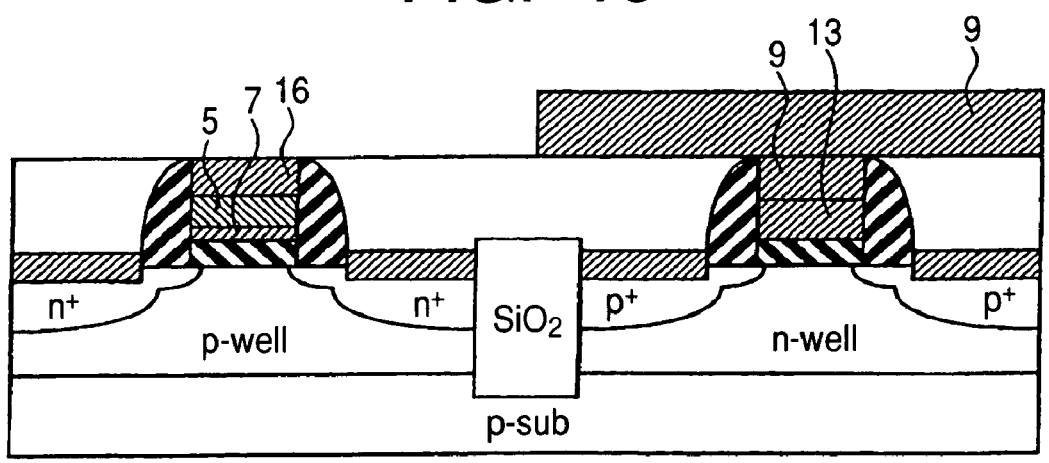
FIG. 10 is an exemplary diagrammatic cross-sectional view in the direction of gate length, showing a process for manufacturing the CMOSFET of the third embodiment subsequent to the process shown in FIG. 9.

Next, only the p-type MIS transistor region is exposed by lithography, and Ni is caused to grow to a thickness of 50 nm by sputtering (FIG. 10).

By performing low-temperature heat treatment at 400° C., all the gate electrodes of the p-type MIS transistor are formed into a polycrystallineline layer of Ni$_3$Si crystal phase. At that time, B in polycrystalline Si is segregated on the interface of the gate insulation film by the snow-plow effect. The structure shown in FIG. 8 can be manufactured by removing unreacted Ni.

According to this manufacturing method, the diffusion rate of Ni achieved during interfacial reaction between Ni and Si can be controlled by inserting the Ti thin layer into the interface between Ni and Si. Consequently, an NiSi$_2$ crystal phase can be formed in the first phase of the reaction.

In this case, the amount of Ni entering Si within a period of unit time is determined by two factors; namely, the thickness of a Ti film, and the temperature of heat treatment. Conditions other than those mentioned above raise no problems, so long as the NiSi$_2$ crystal phase is formed as the first phase by the conditions. Even when an interface insertion layer other than Ti is used, the interface insertion layer, such as Ti or the like, may be used in an optimal thickness, so long as the layer exhibits the role of decreasing the entry rate of Ni as in the case of the embodiment.

When Ni silicide is formed, a native oxide film formed on a surface of polysilicon in the atmosphere is eliminated, since reduction power of Ni is weak. When the native oxide film of the polysilicon is not completely eliminated, a silicide reaction is nonuniform. Accordingly, variation of characteristics between transistors is large.

Figure 24:
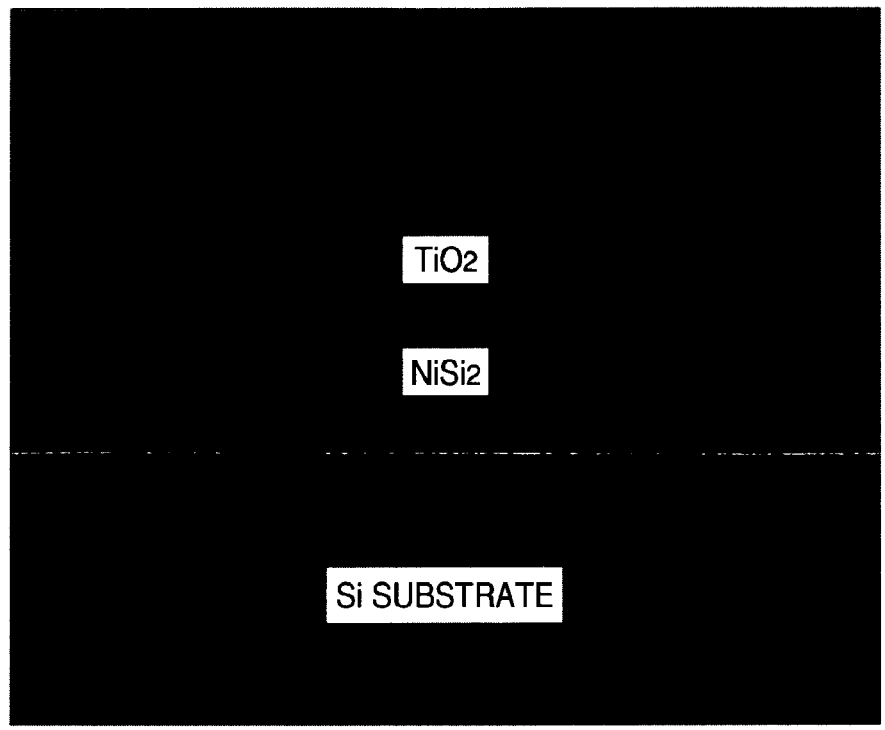
FIG. 24 exemplary shows a transmission electron microscope photograph where a silicide gate electrode is formed as gate electrode of n-type MIS transistor when Ti film and Ni film are formed on a polycrystalline Si according to embodiments without natural oxide film.

FIG. 24 exemplary shows a transmission electron microscope photograph where a silicide gate electrode is formed as gate electrode of n-type MIS transistor when Ti film and Ni film are formed on a polycrystalline Si according to embodiments without an natural oxide film. The gate insulation film is HfSiON. Ti is deposited on Polysilicon Si layer (thickness 100 nm) and Ni is continuously sputtered on Ti deposition. After sputtering Ni, a heat treatment is performed at 450° C. in Ni atmosphere for one minute, so that NiSi$_2$ crystal phase (a cubic crystal) is formed.

Figure 25:
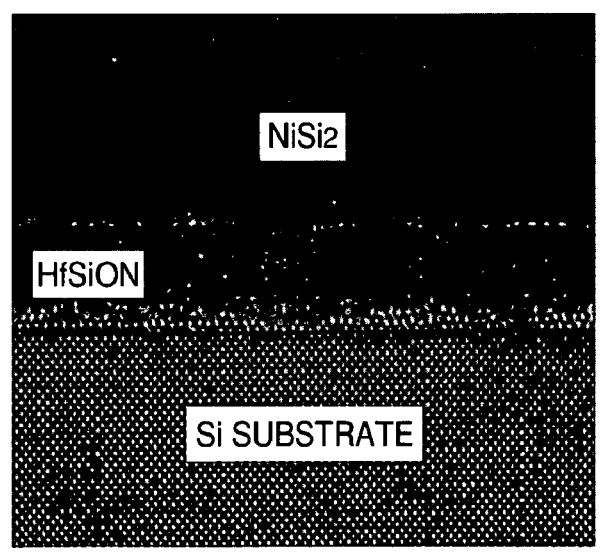
FIG. 25 exemplary shows a high-resolution image of an interface of the gate insulation film of FIG. 24.

FIG. 25 exemplary shows a high-resolution image of an interface of the gate insulation film of FIG. 24. NiSi2 phase is formed on an interface of the gate insulation film, since Ti is a metal with high reducing power, and Ti can reduce the native oxide film easily, so that the silicide reaction is advanced. In this case, as shown in FIG. 24, it is confirmed by EDX. (Energy Dispersive X-ray) analysis that Ti oxidation is formed on an electrode layer. By a producing method according to the embodiment, a silicide can be easily formed in an area where the native oxide film remains and the variation of characteristics between transistors can be restrained. The same effective can be obtained when a metal element that can reduce SiO2 is used as an interface inserting layer. The metal elements for the interface insering layer are, for example, Hf, Zr, Y, La, Er which have a larger negative energy that of $SiO_2$.

The thickness of the Ti thin layer may range from 2 nm to 10 nm. When the thin layer exceeds 10 nm, Ni may fail to diffuse to the Si layer. When the Ti thin film is smaller than 2 nm, diffusion of Ni is too fast, and $NiSi_2$ cannot be formed as an initial layer.

The heat treatment process for forming the $NiSi_2$ crystal phase requires a temperature of 300° to 600° C. When the temperature is lower than 300° C., the diffusion rate of Ni is slow, and diffusion of Ni involves consumption of much time, thereby deteriorating productivity. In contrast, when the temperature is higher than 600° C., the formed $NiSi_2$ phase inflicts damage on the gate insulation film, thereby degrading the reliability of the device.

The heat treatment process depends on the temperature of heat treatment, and may be performed within the range of 10 seconds to one hour. If the heat treatment is performed longer than one hour, manufacturing cost may be increased. In contrast, when the heat treatment is performed shorter than 10 seconds, there may arise a fear of $NiSi_2$ crystal nucleus failing to sufficiently grow in some devices.

The atmosphere of the heat treatment process may be a nitrogen atmosphere.

When the method of the present embodiment is used for forming the source-drain region, a (111) facet is formed along the interface of $NiSi_2$ and Si, and the interface becomes very rough (see O. Nakatsuka et al.). However, as a result of the present method being used for the gate electrode as in the case of the present embodiment, the interface of $NiSi_2$ becomes smooth along the interface of the gate insulation film on the atomic level, and hence roughness does not arise.

Under this manufacturing method, since the $NiSi_2$ crystal phase is formed at low temperature, a mixed crystal phase including NiSi and $NiSi_2$ is not formed along the interface between the gate electrode and the insulation film as mentioned in K. Takahashi et al., unless excessive Ni ions intrude into the gate electrode. The ratio of the thickness of the Ni layer to the thickness of the polycrystalline silicon layer may be adjusted to that employed for forming the $NiSi_2$ crystal phase, as mentioned previously. Specifically, the thickness of the Ni layer may be one-half or less the thickness of the polycrystalline silicon layer.

Under the present manufacturing method, a method of implanting ions after formation of the gate electrode of the $NiSi_2$ crystal phase and the gate electrode of the $Ni_3Si$ crystal phase may also be used as a method for introducing impurities. Alternatively, the "snow-plow" effect and the method for implanting ions after formation of an electrode may also be used in combination.

(Another example of CMOSFET according to Third Embodiment)

Figure 26:
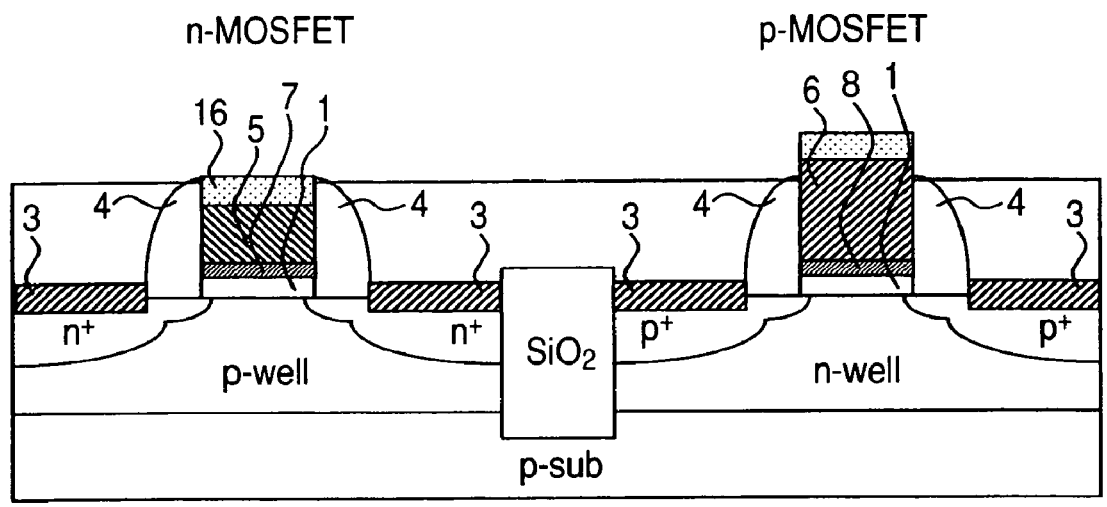
FIG. 26 is an exemplary diagrammatic cross-sectional view in the direction of gate length, showing an another example CMOSFET according to the third embodiment.

FIG. 26 is an exemplary diagrammatic cross-sectional view in the direction of gate length, showing another example of CMOSFET according to the third embodiment. A structure of gate electrode of the p-type MIS transistor is different from that of the gate electrode as shown in FIG. 8. A structure except for the gate electrode is identical to the structure as shown in FIG. 8. In FIG. 26, polycrystalline layer including a crystal grain each grain consisting of a cubic crystal as Ni3Si crystal phase, as described above, is a layer under a gate insulation film side. A layer above the polycrystalline layer is formed of TiSi2 crystal phase of orthorhombic crystal "C49 type." The crystal structure of the layer is C49 type of orthorhombic crystal. In FIG. 26 as well as FIG. 8, B is segregated on an interface between a cubic crystal as Ni3Si crystal phase and gate insulation film. According to the embodiment, a height of gate electrode of p-type MIS transistor is two or three times as large as that of gate electrode of n-type MIS transistor. According to the structure, a structure of interface between gate electrode/gate insulation film is same as the structure as shown in FIG. 8. As described in producing method later, a structure of gate electrode of the example can be produced by a heat process of forming a silicide below 500° C. and reliability of the device is not missed.

(Manufacturing Method of Another Example of CMOSFET According to Third Embodiment)

Figure 27:
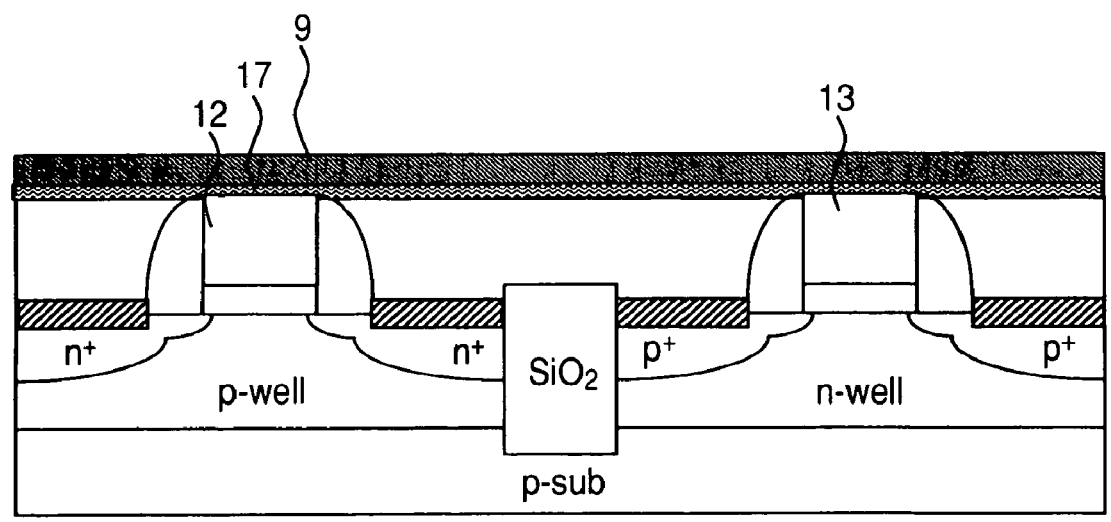
FIG. 27 is an exemplary manufacturing method of semiconductor device according to another example of CMOSFET according to the third embodiment.
Figure 28:
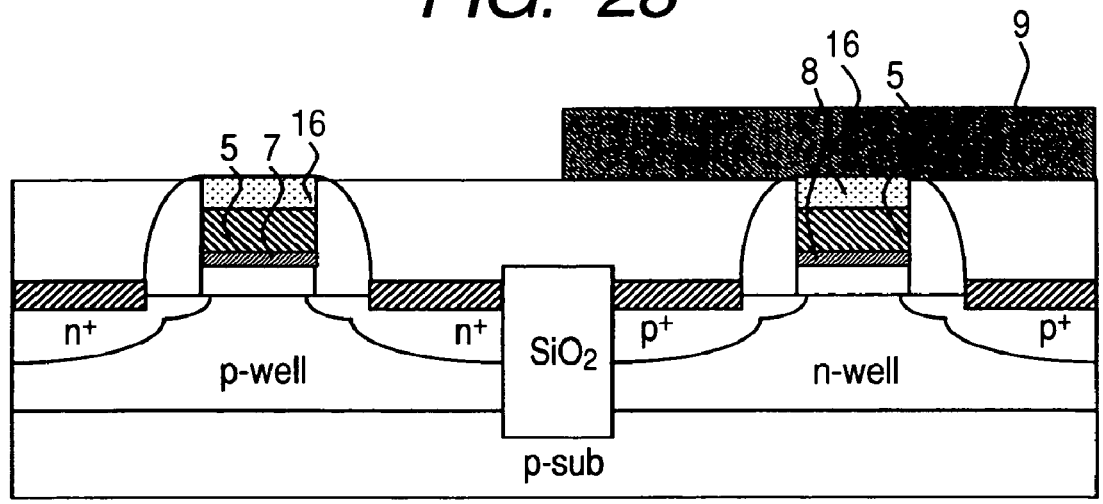
FIG. 28 is an exemplary diagrammatic cross-sectional view in the direction of gate length, showing a process for manufacturing another example of CMOSFET according to the third embodiment subsequent to the process shown in FIG. 27.

A manufacturing method of another example of CMOSFET according to the third embodiment is exemplary described hereinafter, by referring to FIGS. 27 and 28. The manufacturing method is same as that of the first embodiment until a process of exposing upper end portion of the gate electrode is performed by CMP (Chemical Mechanical Polishing). Herein, B is doped in the gate electrode of p-type MIS transitor without forming SiN cap layer, or P is doeped in the gate electrode of n-type MIS transistor at the same time of implantation of P or B ions into the source-drain region. Then, Ti layer (4 nm) and Ni (15 nm) are sputtered in both types MIS transistor area. (refer to FIG. 27.) By heat treatment (at 450° C. for one minute), polycrystalline layer of cubic crystal NiSi2 crystal layer is formed above the gate insulation film in the gate electrodes of both type MIS transistors. $TiSi_2$ crystal phase (8 nm) of orthorhombic crystal (C49 type) is formed on the polycrystalline layer. P or B of polycrystalline Si layer is segregated on the interface of the gate insulation film by the "Snow-Plow" effect.

After eliminating non-reactive Ni, p-type MIS transistor area is exposed by using lithography technology, and Ni (50 nm) is sputtered on the area.

Then, a heat treatment at 400° C. is performed, and all polycrystalline layers of a cubic crystal as NiSi2 crystal phase under a gate electrode of p-type MIS transistor are changed into a polycrystalline layer of $Ni_3Si$ crystal phase. A height of gate electrode of p-type transistor is about 2 or 3 times as large as that of gate electrode of n-type transistor. The structure as shown in FIG. 26 can be obtained after non-reactive Ni is eliminated. According to the manufacturing method, TiSi2 crystal phase (C49 type) is formed on an upper portion of the gate electrode of p-type MIS transistor. TiSi2 phase is stronger than Ni3Si in view of etching resistance with respect to a liquid solution of sulfuric acid-hydrogen peroxide. By taking configuration of the example as describe above, when non-reactive Ni is eliminated, the liquid solution of sulfuric acid-hydrogen peroxide can be used at the same temperature, and the same amount thereof in both cases of formation of NiSi2 and formation of Ni3Si. Accordingly, the manufacturing method can be simple. According to the manufacturing method, an interface inserting layer made of material except for Ti can be used for reducing doping speed of Ni. For example, TiN can be used as the interface inserting layer with a predetermined thickness.

Figure 30:
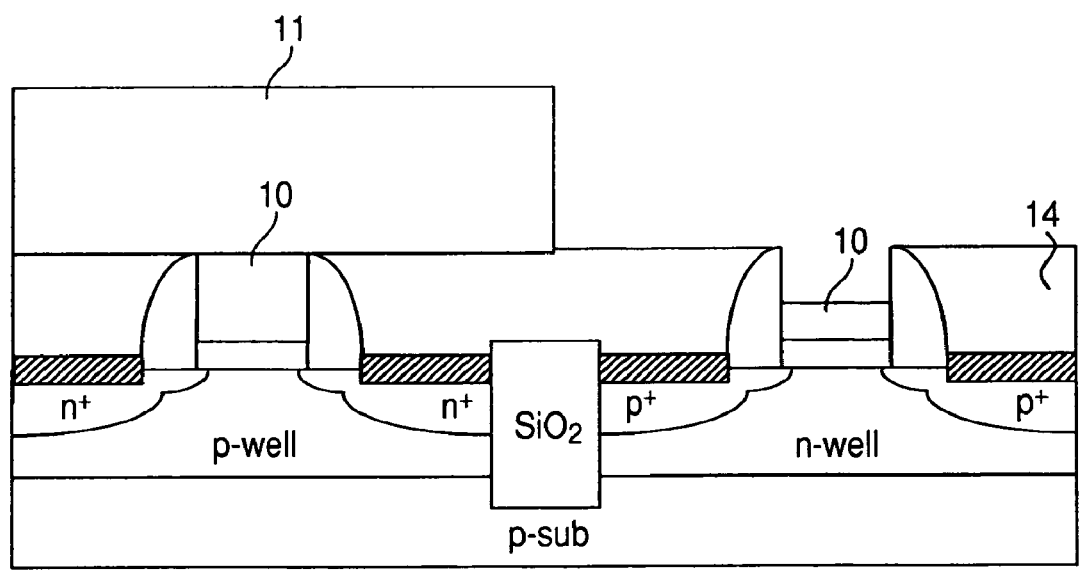
FIG. 30 exemplary shows an another process for manufacturing another example of CMOSFET according to the third embodiment.
Figure 31:
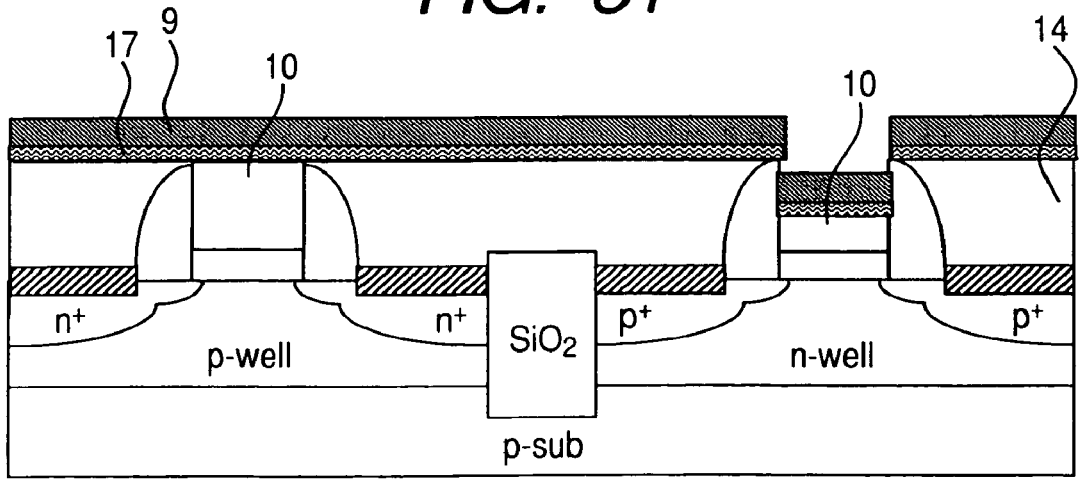
FIG. 31 is an exemplary diagrammatic cross-sectional view in the direction of gate length, showing an another process for manufacturing another example of CMOSFET according to the third embodiment subsequent to the process shown in FIG. 30.

FIGS. 30 and 31 exemplary show another process for manufacturing another example of CMOSFET according to the third embodiment. An another process manufacturing another example of CMOSFET according to the third embodiment is identical to the manufacturing method as shown in FIGS. 27 and 28 (as describe above) until an upper portion of the gate electrode is exposed by CMP (Chemical Mechanical Polishing).

A polysilicon gate electrode of p-type MIS transistor is etched by lithography technology, and the height of the polysilicon gate electrode is 18 nm. (Please refer to FIG. 30.) Ti layer (4 nm) and Ni (15 nm) are sputtered on an MIS transistor area of both type of MIS transistors. (Please refer to FIG. 31.) Then, a heat treatment (at 400° C. for one minute) is performed.

A polycrystalline layer of a cubic crystal of NiSi2 crystal phase is formed above the gate insulation film in a gate electrode of n-type MIS transistor. TiSi2 crystal phase of orthorhombic crystal (C49 type) (about 8 nm) is formed above the polycrystalline layer.

The under layer of the gate electrode of p-type MIS transistor is formed of a polycrystalline layer of Ni3Si crystal phase, and TiSi2 crystal phase of orthorhombic crystal (C49 type) (about 8 nm) is formed above the polycrystalline layer of Ni3Si crystal phase.

Ti layer functions only to adjust a diffusion speed of Ni. A structure and composition of Ni silicide is determined by a thickness of Ni film relative to a height of polysilicon gate electrode. P and B included in polycrystalline Si layer are segregated on the interface of the gate insulation film by the "Snow-Plow" effect.

Figure 29:
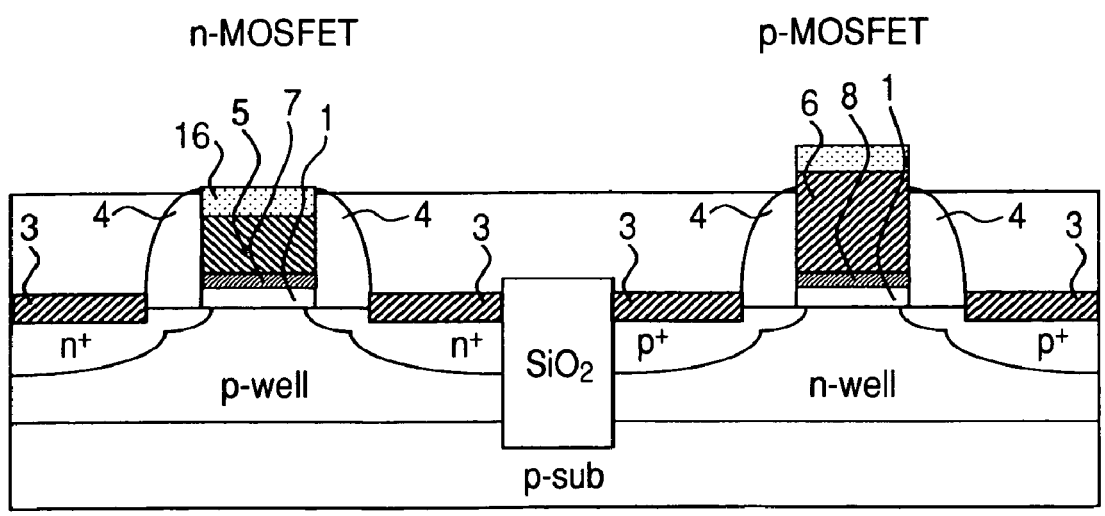
FIG. 29 is an exemplary diagrammatic cross-sectional view in the direction of gate length, showing a process for manufacturing another example of CMOSFET according to the third embodiment subsequent to the process shown in FIG. 28.
Figure 32:
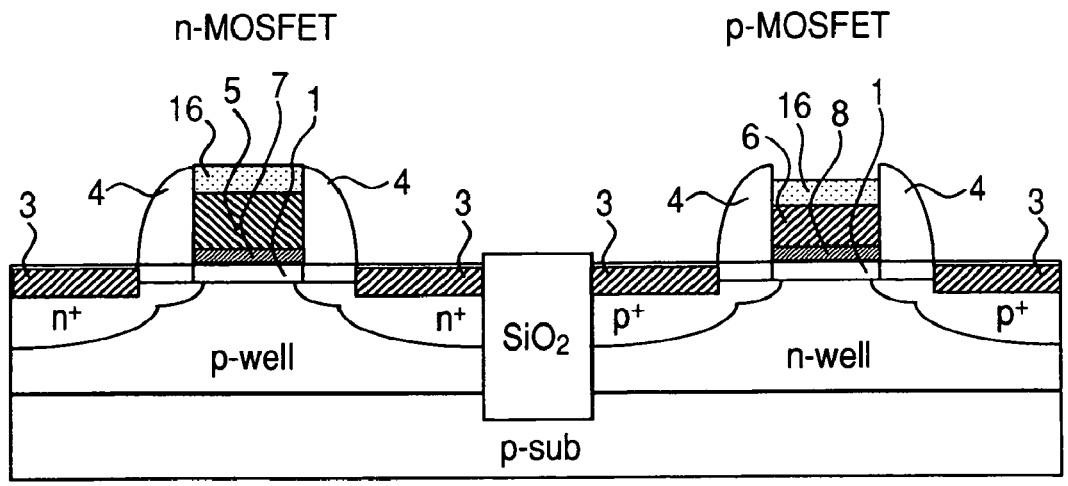
FIG. 32 is an exemplary diagrammatic cross-sectional view in the direction of gate length, showing an another process for manufacturing another example of CMOSFET according to the third embodiment subsequent to the process shown in FIG. 31.

By eliminating non-reactive Ni, a CMIS transistor which has same structure of the structure as shown in FIG. 26 can be formed. (refer to FIG. 32) However, differently from FIG. 25, as shown in FIG. 32, a height of p-type MIS transistor is smaller than that of n-type MIS transistor the differences between both height is 10-30 nm. The difference is smaller that of FIG. 26. Accordingly, it is easy to form contact plug of upper wiring. In the manufacturing method as shown in FIGS. 30 and 31, all processes including a formation process of Ni, lithography process, and a heat treatment of formation of silicide electrode are performed only one time. Accordingly, the manufacturing method as shown in FIGS. 30, 31 is easier than the manufacturing method as shown in FIGS. 27-29 so as to form the above structure.

The height of polysilicon gate electrode of p-type MIS transistor is not limited at 18 nm, but can be made to form Ni3Si phase on all surface of interface of gate insulation film by forming Ni above. A formation thickness of Ni is in such a range that NiSi2 is formed on a whole interface of gate electrode of n-type transistor. In order to comply with the above range, a ratio of a height of polysilicon gate electrode of n-type of MIS transistor with respect to a height of polysilicon gate electrode of p-type of MIS transistor is larger than 0.16 and smaller than 0.35. Herein, a height of both types is defined by subtracting a thickness of polysilicon consumed by forming TiSi2 from a height of polysilicon gate before forming the silicide. Ni silicide phase of both type transistors having a predetermined structure can be formed from the same Ni film by adjusting a thickness of Ni film appropriately in case that the above-ratio is within the range above defined. In the embodiment, the thickness (8.8 nm) of polysilicon is consumed by Ti (4.4 nm), so that the above-defined ratio is 0.22 (9.2 nm/41.2 nm) within the above range.

When p-type transistor is NiSi2, the above ratio is equal to or larger than 0.35, and is equal to or smaller than 0.50.

According to the Manufacturing Method,

In case that n-type MIS transitor and P-type MIS transitor, for example, used as "SRAM circuit", are arranged along a direction of gate width and that gate electrodes are continuously arranged, a composition change area of Ni silicide where compositions are changed in Ni-silicide area on interface of both gate electrodes can be made small.

The composition change area of Ni silicide particularly generates in a periphery of edge of the interface of gate electrodes in case that Ni is selectively formed in a gate electrode area of either one type. However, an edge of Ni film is not generated in the embodiment.

According to another process for manufacturing another example of CMOSFET according to the third embodiment, an interface inserting layer made of material except for Ti can be used for reducing doping speed of Ni. For example, TiN can be used as the interface inserting layer with a predetermined thickness.

Fourth Embodiment

NiSi Upper Layer

Differences between an example CMOSFET according to a fourth embodiment and the CMOSFET of the second embodiment will be described by reference to FIG. 11.

Figure 11:
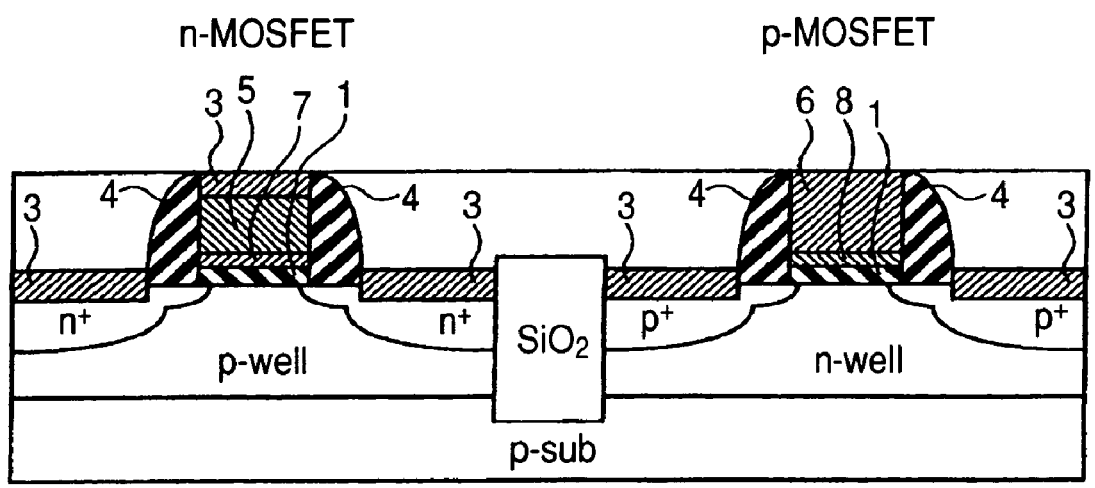
FIG. 11 is an exemplary diagrammatic cross-sectional view in the direction of gate length, showing an example CMOSFET according to a fourth embodiment.

FIG. 11 is a cross-sectional schematic view of the example CMOSFET of the fourth embodiment in the direction of gate length.

As shown in FIG. 11, a difference between the CMOSFET of the present embodiment and its counterpart shown in FIG. 5 lies in the structure of the electrode of the n-type MIS transistor. In other respects, the CMOSFETs are structurally identical with each other. In relation to the structure of the electrode of the n-type MIS transistor, a lower layer on the part, facing the gate insulation film, of the interface is formed from a polycrystallineline layer (a cubic $NiSi_2$ crystal phase) where crystal grains have a cubic crystal structure and a 1:2 Ni—Si composition, and an upper layer of the same is formed from an orthorhombic NiSi crystal phase having a crystal structure of orthorhombic MnP type. P is unevenly distributed over the interface between the $NiSi_2$ layer and the gate insulation film, as in the case of the embodiment shown in FIG. 5.

In relation to the structure of the present embodiment, the structure of the interface between the gate electrode and the gate insulation film is analogous to its counterpart shown in FIG. 5, and the advantage of the structure is also identical. The NiSi phase, which is lower in resistance than the $NiSi_2$ phase, is formed. Therefore, the sheet resistance value of the gate electrode of the n-type MIS transistor is made lower than that of the gate electrode of the second embodiment, and the device can operate at higher speed. Although detailed descriptions are provided in connection with the manufacturing method, the structure of the gate electrode of the present embodiment can also be manufactured through the heat process for forming silicide at a temperature of 500° C. or less, and the reliability of the device is not impaired.

In FIG. 11, the impurity segregated layers 7, 8 are formed in accordance with the second embodiment. However, in the fourth embodiment, these layers may be omitted as in the case of the first embodiment.

Fourth Embodiment

Manufacturing Method 1: Gate Upper Layer Phase change $NiSi_2 \Rightarrow NiSi$

Figure 12:
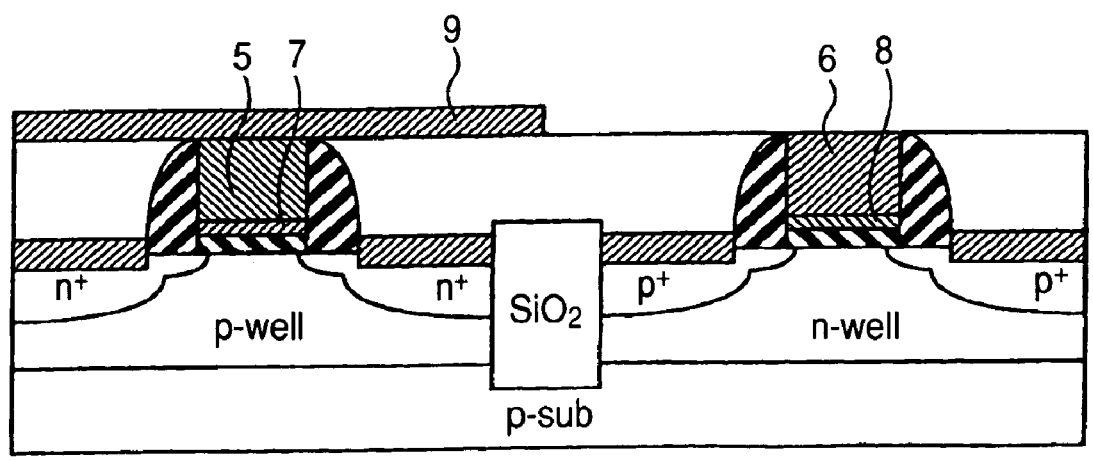
FIG. 12 is an exemplary diagrammatic cross-sectional view in the direction of gate length, showing an example process of manufacturing the CMOSFET of the fourth embodiment.
Figure 13:
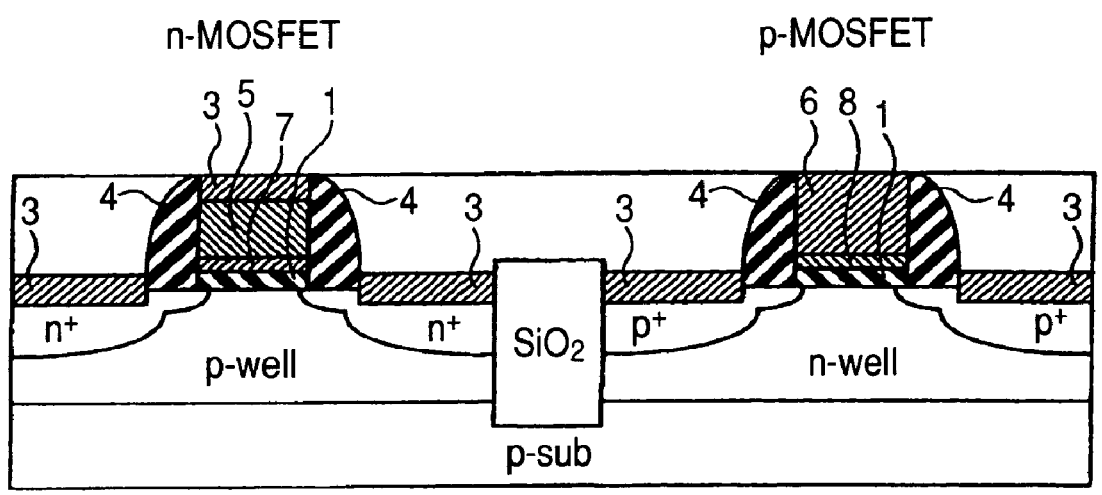
FIG. 13 is an exemplary diagrammatic cross-sectional view in the direction of gate length, showing a process for manufacturing the CMOSFET of the fourth embodiment subsequent to the process shown in FIG. 12.

An example method for manufacturing a semiconductor device of the fourth embodiment will be described by reference to FIGS. 12 and 13.

First, the structure shown in FIG. 5 is formed according to the previously described manufacturing method. Subsequently, an Ni layer of 5 nm is formed in only the n-type MIS transistor region through use of lithography (FIG. 12).

Subsequently, the structure is subjected to the heat process for one minute at 400° C., whereby the phase of the upper portion of the gate electrode of the n-type MIS transistor is transformed from the $NiSi_2$ crystal phase to the NiSi crystal phase. Thus, the structure shown in FIG. 13 can be formed.

Even under the present manufacturing method, impurities may be introduced after formation of the gate electrode of $NiSi_2$ and the gate electrode of $Ni_3Si$, or by a combination thereof.

The specific resistance value of the NiSi crystal phase is about half that of the $NiSi_2$ crystal phase. As a result of the upper portion of the gate electrode of $NiSi_2$ crystal phase being transformed into the NiSi crystal phase, the resistance of the gate electrode can be reduced, and higher-speed operation of the device can be implemented.

Fourth Embodiment

Manufacturing Method 2: Implant Ni ions into the Middle of the Gate

An example process for manufacturing the semiconductor device of the fourth embodiment will be described by reference to FIGS. 14 to 17.

The method is identical with the previously-described method up to the process of exposing the upper end of the gate electrode by CMP (Chemical-Mechanical Polishing).

Like the case shown in FIG. 2, Ni ions are implanted while the upper portion of the polycrystalline Si gate electrodes of both conductivity types are exposed. In this case, the acceleration voltage is set to 30 keV or thereabouts, whereby the peak depth of Ni ions comes to 20 nm or thereabouts from the surface of the polycrystalline Si electrode. The amount of ions implanted is $5 \times 10^{15}$ $cm^{-2}$ or more. At this time, the upper portion of the gate electrode assumes an amorphous structure, because of damage inflicted by ion implantation.

Figure 14:
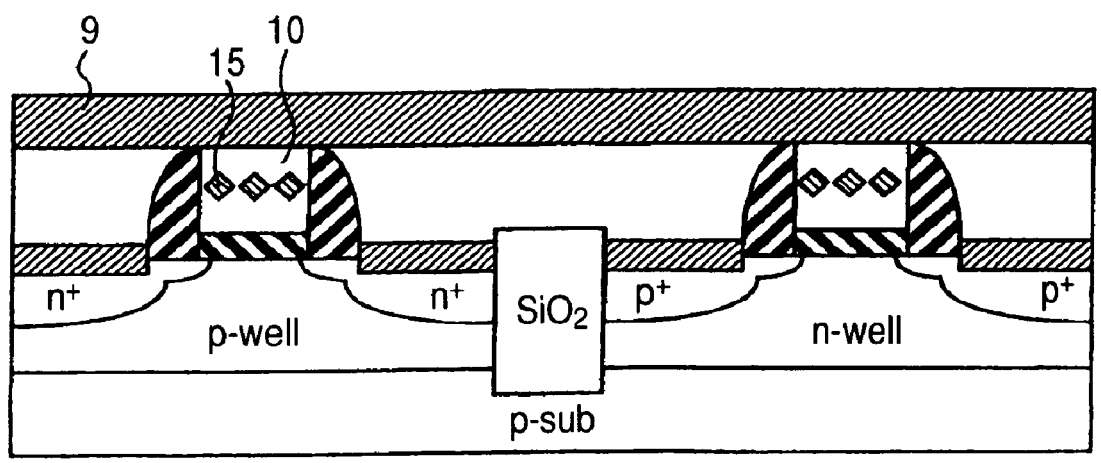
FIG. 14 is an exemplary diagrammatic cross-sectional view in the direction of gate length, showing another example process of manufacturing the CMOSFET of the fourth embodiment.
Figure 15:
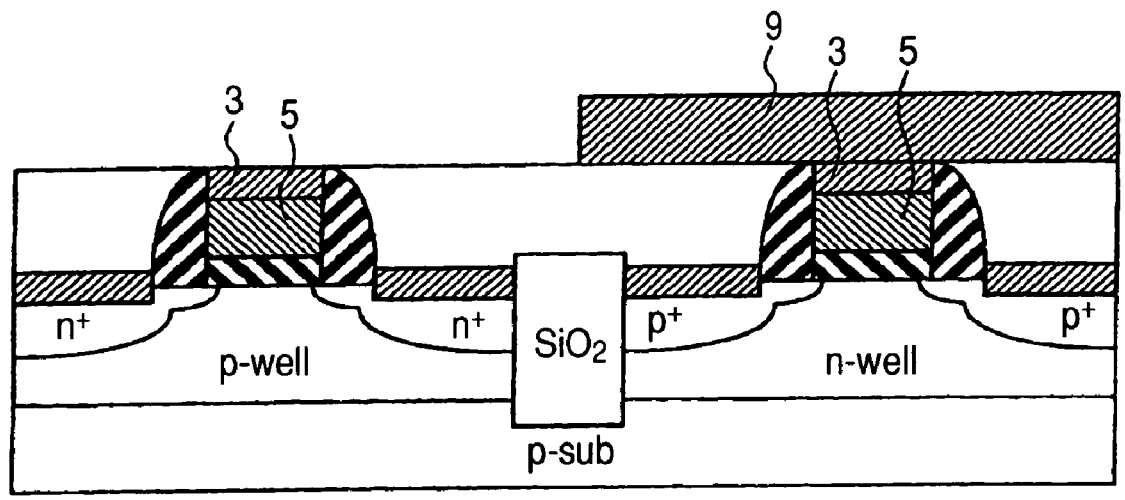
FIG. 15 is an exemplary diagrammatic cross-sectional view in the direction of gate length, showing a process for manufacturing the CMOSFET of the fourth embodiment subsequent to the process shown in FIG. 14.

Subsequently, the structure is subjected to the heat process for 30 minutes at 350° C., whereby $NiSi_2$ crystal bulks, which measure 10 nm or thereabouts and assume a $CaF_2$ structure, are formed at a depth of about 20 nm in the polycrystalline Si gate electrode. An Ni film of 20 nm is formed by sputtering (FIG. 14). Subsequently, the film is subjected to low-temperature heat treatment at 500° C. or less, whereby Ni diffuses into Si, and an NiSi crystal phase is formed in an area which is shallow with respect to the position 20 nm. Concurrently, in an area which is deeper than the position (20 nm from the surface) where $NiSi_2$ crystal bulks are formed, $NiSi_2$ crystal grows while taking the previously-formed $NiSi_2$ bulks as the seed of growth, and an $NiSi_2$ crystal phase is formed up to the interface of the gate insulation film.

Subsequently, the crystal is subjected to lithography, to thus form an Ni film of 25 nm in only the region where the p-type MIS transistor is fabricated (FIG. 15), and the film is subjected to heat treatment at 400° C., thereby forming $Ni_3Si$ in only the gate electrode of the p-type MIS transistor.

Figure 16:
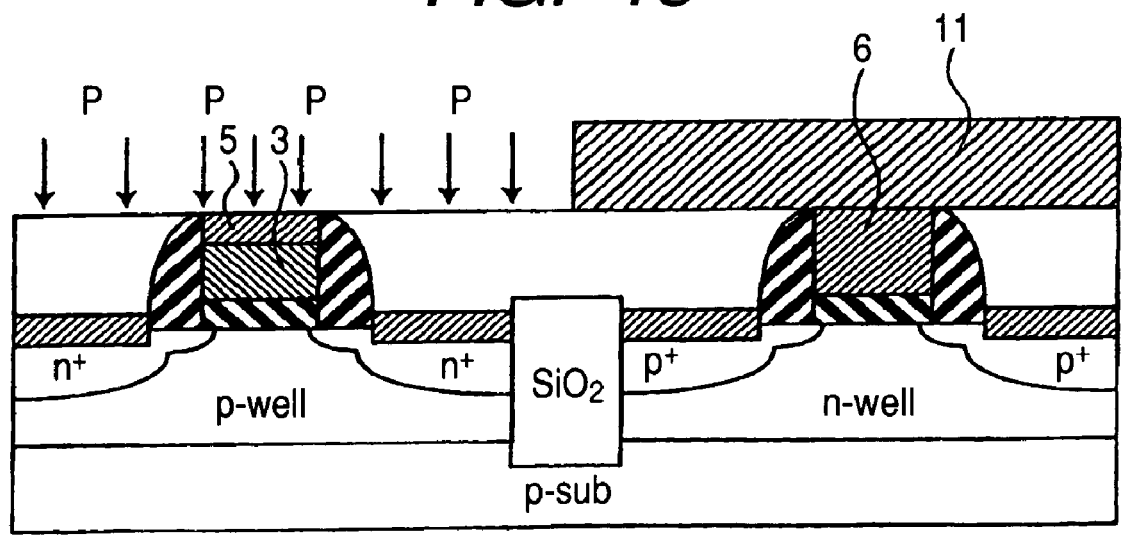
FIG. 16 is an exemplary diagrammatic cross-sectional view in the direction of gate length, showing a process for manufacturing the CMOSFET of the fourth embodiment subsequent to the process shown in FIG. 15.
Figure 17:
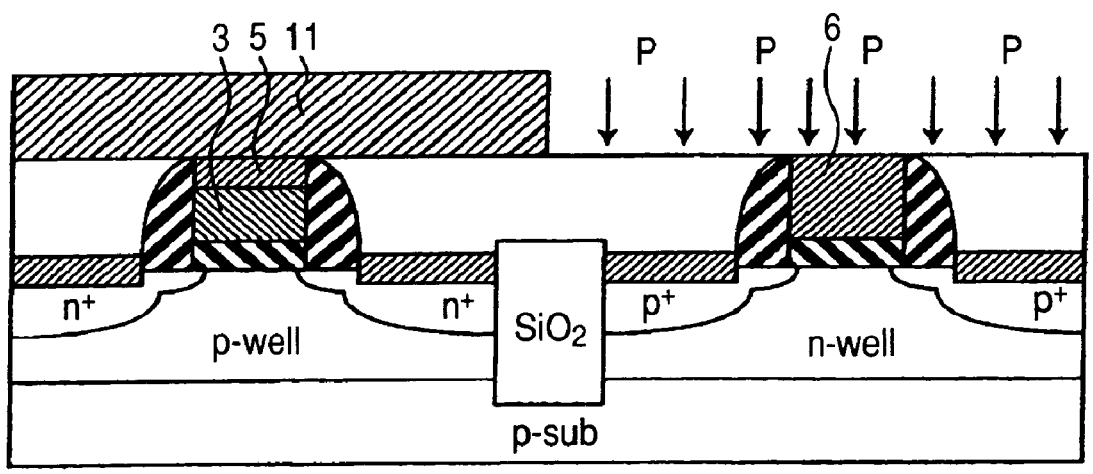
FIG. 17 is an exemplary diagrammatic cross-sectional view in the direction of gate length, showing a process for manufacturing the CMOSFET of the fourth embodiment subsequent to the process shown in FIG. 16.

After removal of unreacted Ni, only the region where the n-type MIS transistor is fabricated is exposed by lithography, and the p-type MIS transistor region is covered with a resist or a hard mask. In this state, P ions are implanted at 5 keV to a concentration of $1 \times 10^{16}$ $cm^{-2}$ (FIG. 16). By the same method, only the region where the p-type MIS transistor is fabricated is exposed, and B ions are implanted at 1 keV to a concentration of $1 \times 10^{16}$ $cm^{-2}$ (FIG. 17).

The B and P ions subsequently implanted into the gate electrode through heat treatment at 400° C. for 30 minutes diffuse the crystal boundary of the polycrystallineline Ni silicide layer, and are segregated on the interface of the gate insulation film. Thus, the structure shown in FIG. 11 can be manufactured. Even under the manufacturing method, addition of impurities may be performed concurrently with implantation of ions into the source-drain region.

(Modification)

The first through fourth embodiments have been described by reference to a planar semiconductor device on a bulk substrate. However, the first to fourth embodiments can also be applied to a planar semiconductor device on an SOI substrate or an Fin-type semiconductor device.

(First Modification: Planar Semiconductor Device on SOI Substrate)

An example CMOSFET according to a modification will be described by reference to FIG. 18.

Figure 18:
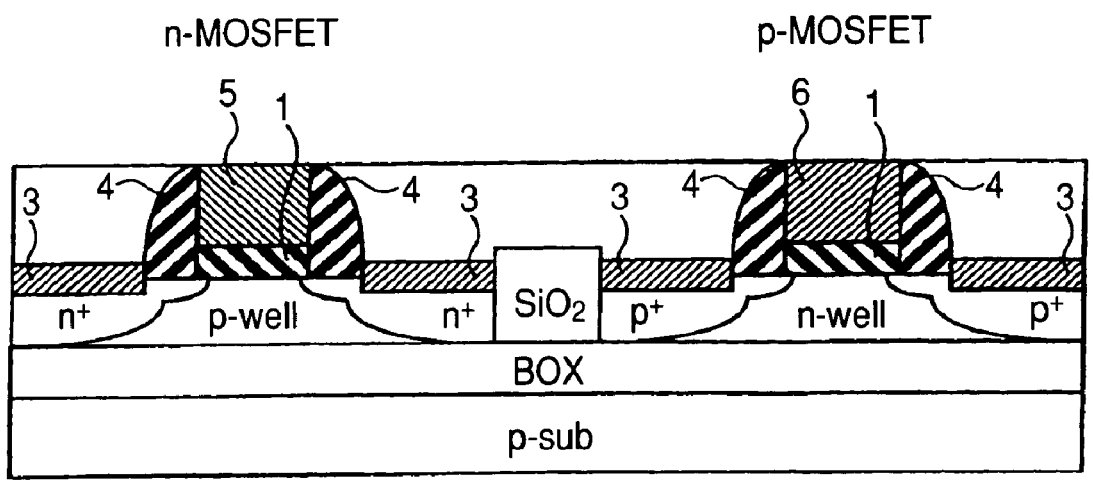
FIG. 18 is an exemplary diagrammatic cross-sectional view in the direction of gate length, showing an example CMOSFET according to a first modification.

As shown in FIG. 18, a CMIS device is fabricated on an SOI substrate. The structure of the CMIS device is identical with the structure shown in FIG. 1. The thickness of an Si active region of the SOI substrate where the CMIS device is fabricated is 15 nm, and the present device is a so-called fully-depleted CMIS device.

In the fully-depleted device, the doping level of impurities in the channel region of the substrate is low, and the channel region is fully depleted. Accordingly, the effective work function $\Phi$eff of the gate electrode required to realize high-speed operation of the device differs from that required for the bulk device. Specifically, in the case of the bulk device, the effective work function $\Phi$eff comes to the end of the forbidden band of Si. In the fully-depleted device, the effective work function $\Phi$eff for the gate electrodes of both conductivity types is closer to Si-midgap by 0.2 eV. In the present embodiment, the $NiSi_2$ crystal phase and the $NiSi_3$ crystal phase are used for the respective gate electrodes, and the effective work functions $\Phi$eff of the crystal phases assume values optimal for high-speed operation of the perfectly-depleted device.

FIG. 18 is a view of a mode adaptive to the first embodiment. As a matter of course, the first modification may be of a mode adaptive to any of the second to fourth embodiments.

The gate electrodes of both conductivity types may be switched on the SOI substrate. By this structure, the operation threshold voltage is increased by about 0.5 eV when compared with the operation threshold voltage achieved in the case shown in FIG. 18. This leads to a decrease in consumption of standby power during operation standby, and low power consumption of the CMIS device can be implemented by use of this structure.

(Second Modification: Fin-type Semiconductor Device)

An example CMOSFET of the modification will be described by reference to FIG. 19.

Figure 19:
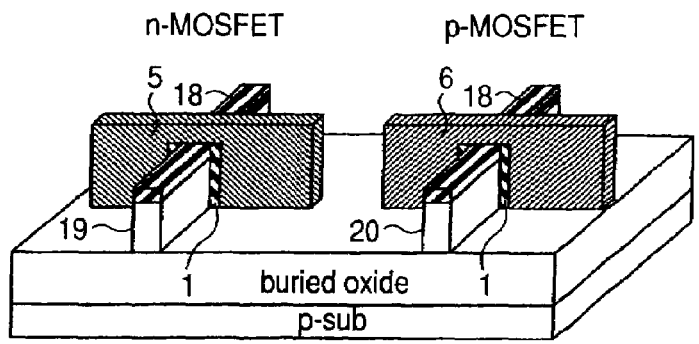
FIG. 19 is an exemplary bird's eye view showing an example CMOSFET according to a second modification.

As shown in FIG. 19, a buried oxide, which is a deposited silicon oxide film, is formed on a p-type silicon substrate. A Fin structure, forming the source-drain region of a transistor, is formed on the buried oxide. In an illustrated structure, the Fin structure corresponds to a stacked structure consisting of a p-type Si layer and an SiN layer in the n-type MIS transistor. In the p-type MIS transistor, the Fin structure corresponds to a stacked structure consisting of an n-type Si layer and an SiN layer. Further, the Fin structure can also be formed from a single Si layer or an insulation layer other than SiN.

The gate electrodes 5, 6 are formed from Ni silicide so as to cross these Fin structures, and a silicon oxide film—serving as a gate insulation film 1—is formed in the contact interface. In the n-type MIS transistor, the gate electrode consisting of Ni silicide is a polycrystallineline film of $NiSi_2$ crystal phase, and the gate electrode is a polycrystallineline film of $Ni_3Si$ crystal phase in the p-type MIS transistor.

This structure corresponds to a so-called double gate MIS transistor, where an MIS transistor having a channel section is fabricated on either side surface portion of the Fin section. When a single Si layer is used for the Fin section, the upper portion of Fin also becomes a channel region, so that a tri-gate MIS transistor is formed.

Although not illustrated, a source region and a drain region, both belonging to an n-type heavily-doped impurity region, are formed in the p-type Fin as a source-drain section such that a channel region is sandwiched between the source and the drain. A source region and a drain region, both belonging to a p-type heavily-doped impurity region, are formed in a Fin of n-type impurity. In a device element having a three-dimensional structure as described in connection with the second modification, extreme difficulty is encountered in rendering the height wise doping level of impurities uniform. Accordingly, a Schottky source-drain structure may also be adopted.

The second modification is an embodiment where the gate electrode interfacial structure shown in FIG. 1 is applied to the Fin-type fully-depleted transistor. The present embodiment is also directed to the perfectly-depleted device as in the case of the first modification. Accordingly, the effective work function Φeff of the gate electrodes is optimal for the high-speed operation CMIS device. By switching the structures of the gate electrodes of both conductivity types, a CMIS device of lower power consumption can also be implemented.

As mentioned above, the structure of the gate electrode interface according to the present invention can also be applied to a transistor of three-dimensional structure regardless of the transistor of planar type. In relation to the manufacturing method, the manufacturing method for planar type can be applied, so long as the method is optimized.

Although the present embodiment has used a double-gate MIS transistor of Fin structure, there can also be used a planar double gate CMIS transistor, a portrait double gate CMIS transistor, or another device element of three-dimensional structure.

FIG. 19 is a view adaptive to the first embodiment. However, as a matter of course, the second modification may be adaptive to the second to fourth embodiments.

According to the embodiments, a semiconductor device includes small variations in threshold value, and a method for manufacturing the same.

Although the embodiments have been described thus far, the present invention is not limited to these embodiments. The present invention is liable to various alterations within the scope of gist of the present invention described in claims. Further, the present invention can be modified in various manners at the practical stage within the scope of the gist of the invention. Moreover, the plurality of constituent elements described in the embodiments are combined, as appropriate, whereby various inventions can be created.

What is claimed is:

1. A method for manufacturing a semiconductor device comprising:
    forming a first gate insulation layer on a p-type semiconductor layer;
    forming a first polycrystalline silicon layer on the first gate insulation layer;
    forming a first source-drain region on a surface of the p-type semiconductor layer where the first polycrystalline silicon layer is sandwiched;
    performing an ion implantation of Ni into the first polycrystalline silicon layer;
    performing a heat treatment for forming a NiSi2 crystal nucleus in the first polycrystalline silicon layer at a temperature of 300° C. to 800° C.;
    forming on the first polycrystalline silicon layer a first Ni layer whose thickness is 5/18 to 1/2 with respect to the thickness of the first polycrystalline silicon layer; and
    transforming the first polycrystalline silicon layer into a crystal phase of NiSi2 by performing a heat treatment for growing the NiSi2 crystal nucleus at a temperature of 300° C. to 600° C.

2. A method for manufacturing a semiconductor device comprising:
    forming a first gate insulation layer on a p-type semiconductor layer;
    forming a first polycrystalline silicon layer on the first gate insulation layer;
    forming a first source-drain region on a surface of the p-type semiconductor layer where the first polycrystalline silicon layer is sandwiched;
    forming a first Ti thin layer on the first polycrystalline silicon layer;
    forming a first Ni layer on the first Ti thin layer; and
    performing a heat treatment for transforming a multilayer (the first Ni layer/the first Ti thin layer/the first polycrystalline silicon layer) into a multilayer (a TiSi2 crystal phase/an NiSi2 crystal phase) at a temperature of 300° C. to 600° C.

3. A method for manufacturing a semiconductor device, comprising:
    forming a first gate insulation layer on a p-type semiconductor layer;
    forming a second gate insulation layer on an n-type semiconductor layer;
    forming a first polycrystalline silicon layer on the first gate insulation layer;
    forming a second polycrystalline silicon layer on the second gate insulation layer;
    forming a first source-drain region on a surface of the p-type semiconductor layer where the first polycrystalline silicon layer is sandwiched;
    forming a second source-drain region on a surface of the n-type semiconductor layer where the second polycrystalline silicon layer is sandwiched;
    forming a first Ti thin layer on the first polycrystalline silicon layer;
    forming a first Ni layer on the first Ti thin layer;
    forming a second Ni layer, or a second Ti thin layer and the second Ni layer in order, on the second polycrystalline silicon layer;
    performing a first heat treatment at a temperature of 300° C. to 600° C., for transforming a multilayer (the first Ni layer/the first Ti thin layer/the first polycrystalline silicon layer) into a first multilayer (a TiSi2 crystal phase/an NiSi2 crystal phase); and
    performing a second heat treatment for forming a Ni3Si crystal phase or a Ni31Si12 crystal phase from the second polycrystalline silicon layer.

4. The method for manufacturing a semiconductor device according to claim 3, further comprising:
    performing the first heat treatment, for further transforming a multilayer (the second Ni layer/the second Ti thin layer/the second polycrystalline silicon layer) into a multilayer (a NiSi crystal phase/the second polycrystalline silicon layer);
    forming a third Ni layer on the NiSi crystal phase after performing the first heat treatment; and
    performing the second heat treatment at the temperature of 300° C. to 600° C., for transforming a multi layer (the third Ni layer/the NiSi crystal phase/the second polycrystalline silicon layer) into the Ni3Si crystal phase or the Ni31Si12 crystal phase.

5. The method for manufacturing a semiconductor device according to claim 3, further comprising:

forming the second Ti thin layer at the same time of forming the first Ti thin layer;

forming the second Ni layer at the same time of forming the first Ni layer;

performing the first heat treatment for further transforming a multilayer (the second Ni layer/the second Ti layer/the second polycrystalline silicon layer) into a second multilayer (the TiSi2 crystal phase/the NiSi2 crystal phase);

forming a third Ni layer on the second multi layer (the TiSi2 crystal phase/the NiSi2 crystal phase); and performing the second heat treatment for transforming a multi layer (the third Ni layer/the TiSi2 crystal phase/the NiSi2 crystal phase), into a multi layer (the TiSi2 crystal phase/the Ni3Si crystal phase) or a multi layer (the TiSi2 crystal phase/the Ni31Si12 crystal phase).

6. The method for manufacturing a semiconductor device according to claim 3, comprising;

etching a part of the second polycrystalline silicon layer so as to reduce a thickness of the second polycrystalline silicon layer forming the second Ti thin layer at the same time of forming the first Ti thin layer;

forming the second Ni layer at the same time of forming the first Ni layer; and performing the second heat treatment, for transforming a multilayer (the second Ni layer/the second Ti layer/the second polycrystalline silicon layer) into a multi layer (the TiSi2 crystal phase/the Ni3Si crystal phase) or a multi layer (the TiSi2 crystal phase/the Ni31Si12 crystal phase), at the same time of the first heat treatment.

7. The method for manufacturing a semiconductor device according to claim 3, comprising;

forming the first Ni layer whose thickness is 5/18 to 1/2 with respect to the thickness of the first polycrystalline silicon layers.

8. The method for manufacturing a semiconductor device according to claim 3, comprising;

performing an ion implantation of at least one of phosphor, arsentic, and antimony into the first polycrystalline silicon layer; and performing an ion implantation of boron into the second polycrystalline silicon.

9. The method for manufacturing a semiconductor device according to claim 3, comprising performing an ion implantation of at least one of phosphor, arsentic, and antimony into the multilayer (the TiSi2 crystal phase/the NiSi2 crystal phase) after the Ni3Si crystal phase or the Ni31Si12 crystal phase is formed; and performing an ion implantation of boron into either one of the Ni3Si crystal phase and the Ni31Si12 crystal phase.

10. The method for manufacturing a semiconductor device according to claim 3, wherein the thickness of the first Ti thin layer ranges from 2 nm to 10 nm.

* * * * *